United States Patent
Lin et al.

(10) Patent No.: US 12,300,717 B2
(45) Date of Patent: May 13, 2025

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Yu-Chang Lin, Hsinchu (TW); Chun-Hung Wu, New Taipei (TW); Liang-Yin Chen, Hsinchu (TW); Huicheng Chang, Tainan (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 543 days.

(21) Appl. No.: 17/670,740

(22) Filed: Feb. 14, 2022

(65) Prior Publication Data

US 2023/0042196 A1 Feb. 9, 2023

Related U.S. Application Data

(60) Provisional application No. 63/230,108, filed on Aug. 6, 2021.

(51) Int. Cl.
*H01L 29/06* (2006.01)
*H01L 21/8234* (2006.01)
*H01L 29/786* (2006.01)

(52) U.S. Cl.
CPC .. *H01L 29/0665* (2013.01); *H01L 21/823412* (2013.01); *H01L 21/823418* (2013.01);
(Continued)

(58) Field of Classification Search
CPC ......... H01L 29/0665; H01L 21/823412; H01L 21/823418; H01L 21/823468; H01L 29/78696; H01L 21/26586; H01L 21/26513; H01L 29/0646; H01L 29/0673; H01L 29/0847; H01L 29/165; H01L 29/167; H01L 29/66545; H01L 29/7848;
(Continued)

(56) References Cited

U.S. PATENT DOCUMENTS 9,209,247 B2   12/2015   Colinge et al.
9,236,267 B2   1/2016    De et al.
(Continued)

*Primary Examiner* — Kyoung Lee
*Assistant Examiner* — Sophia W Kao
(74) *Attorney, Agent, or Firm* — Slater Matsil, LLP

(57) ABSTRACT

A method includes depositing a multi-layer stack over a semiconductor substrate, the multi-layer stack including a plurality of sacrificial layers that alternate with a plurality of channel layers; forming a first recess in the multi-layer stack; forming first spacers on sidewalls of the sacrificial layers in the first recess; depositing a first semiconductor material in the first recess, where the first semiconductor material is undoped, where the first semiconductor material is in physical contact with a sidewall and a bottom surface of at least one of the first spacers; implanting dopants in the first semiconductor material, where after implanting dopants the first semiconductor material has a gradient-doped profile; and forming an epitaxial source/drain region in the first recess over the first semiconductor material, where a material of the epitaxial source/drain region is different from the first semiconductor material.

20 Claims, 31 Drawing Sheets

(52) U.S. Cl.
CPC ............... *H01L 21/823468* (2013.01); *H01L 29/78618* (2013.01); *H01L 29/78696* (2013.01)

(58) Field of Classification Search
CPC ....... H01L 21/823814; H01L 29/42392; H01L 29/66439; H01L 29/775; H01L 21/823807; B82Y 10/00
See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2014/0167161 A1* | 6/2014 | Tan .................... H01L 29/7841 438/151 |
| 2020/0220018 A1* | 7/2020 | Jang ..................... H01L 29/775 |
| 2020/0303521 A1* | 9/2020 | Son ................... H01L 29/78696 |
| 2021/0104616 A1* | 4/2021 | Su .................... H01L 29/78696 |
| 2021/0134721 A1* | 5/2021 | Chiang ............ H01L 29/66553 |
| 2021/0202697 A1* | 7/2021 | Young ................ H01L 29/0673 |
| 2021/0257499 A1* | 8/2021 | Shin .................. H01L 29/42376 |
| 2022/0037465 A1* | 2/2022 | Lin ....................... H01L 29/775 |
| 2022/0199618 A1* | 6/2022 | Jung ................... H01L 21/0262 |
| 2023/0261048 A1* | 8/2023 | Lin .................... H01L 29/0847 |

* cited by examiner

SEMICONDUCTOR DEVICE AND METHOD OF MANUFACTURE

PRIORITY CLAIM AND CROSS-REFERENCE

This patent application claims priority to U.S. Provisional Application No. 63/230,108 filed on Aug. 6, 2021 and entitled "Gradient IMP for Iboff Reduction in Nanosheet Structure," which application is hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
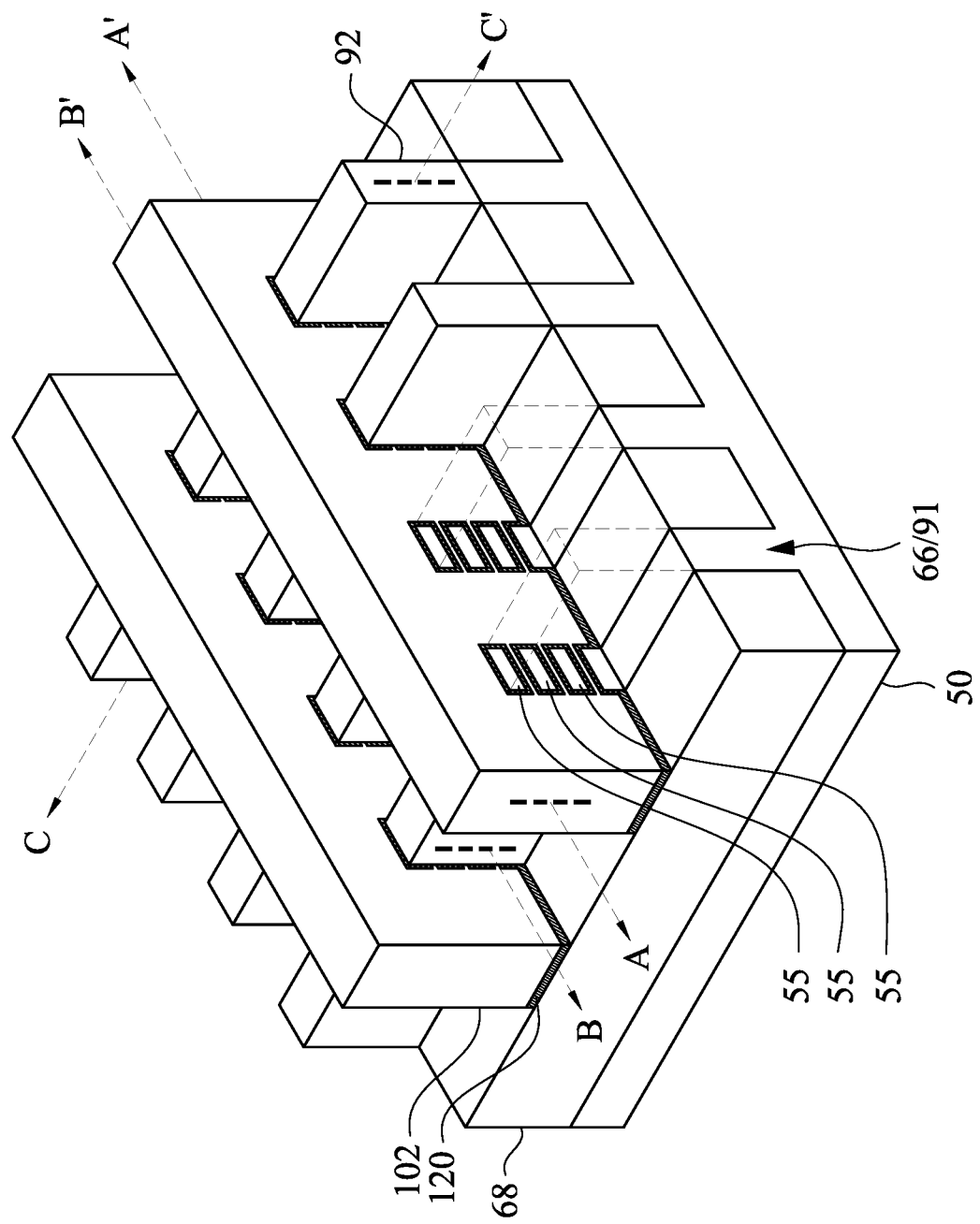
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide semiconductor devices having improved performance and methods of forming the same. The semiconductor devices may be nanostructure field-effect transistors (nano-FETs, also referred to as nanosheet field-effect transistors (NSFETs), nanowire field-effect transistors (NWFETs), or gate-all-around field-effect transistors (GAAFETs)). These embodiments include methods applied to, but not limited to, performing an anti-punch-through (APT) implantation on an upper portion of a semiconductor fin, followed by forming semiconductor nanostructures over the semiconductor fin. A recess is formed in the semiconductor nanostructures and the semiconductor fin. Subsequently, an undoped silicon layer is formed in the recess. An ion implantation process is performed on the silicon layer such that the silicon layer has a gradient-doped profile. A source/drain region is then formed in the recess over the gradient-doped silicon layer. Advantageous features of one or more embodiments disclosed herein may include a reduction of the enlarged electric field that forms as result of the APT implantation, and therefore the mitigation of the junction leakage current ($I_{boff}$) caused by the enlarged electric field. In addition, the disclosed embodiments lead to improved device performance as the junction leakage current may be reduced by an order of magnitude that is in a range from 1 to 2. Further, the disclosed method may be integrated easily into existing processes and provides a solution to junction leakage current with lower manufacturing costs.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Shallow trench isolation (STI) regions 68 are disposed between adjacent fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the STI regions. Additionally, although bottom portions of the fins 66 are illustrated as being single, continuous materials with the substrate 50, the bottom portions of the fins 66 and/or the substrate 50 may comprise a single material or a plurality of materials. In this context, the fins 66 refer to the portion extending between the neighboring STI regions 68.

Gate dielectric layers 120 are over top surfaces of the fins 66 and along top surfaces, sidewalls, and bottom surfaces of the nanostructures 55. Gate electrodes 102 are over the gate dielectric layers 120. Epitaxial source/drain regions 92 are disposed on the fins 66 on opposing sides of the gate dielectric layers 120 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is parallel to cross-section A-A' and extends through epitaxial source/drain regions 92 of multiple nano-FETs. Cross-section C-C' is perpendicular to cross-section A-A' and is parallel to a longitudinal axis of a fin 66 of the nano-FET and in a direction of, for example, a current flow between the epitaxial source/drain regions 92 of the nano-FET. Subsequent figures refer to these reference cross-sections for clarity.

Some embodiments discussed herein are discussed in the context of nano-FETs formed using a gate-last process. In other embodiments, a gate-first process may be used.

FIGS. 2 through 13A and FIGS. 13E through 22B are cross-sectional views of intermediate stages in the manufacturing of nano-FETs, in accordance with some embodiments. FIGS. 2 through 5, 6A, 7A, 8A, 9A, 12A, 14A, 15A, 16A, 17A, 18A, 19A, 20A, 21A and 22A illustrate reference cross-section A-A' illustrated in FIG. 1. FIGS. 6B, 7B, 8B, 9B, 12B, 14B and 14C, illustrate reference cross-section B-B' illustrated in FIG. 1. FIGS. 6C, 7C, 8C, 9C, 10, 11, 12C, 12D, 12E, 13A, 13E, 13F, 14D, 15B, 16B, 17B, 18B, 19B, 20B, 20C, 20D, 21B, and 22B illustrate reference cross-section C-C' illustrated in FIG. 1.

Figure 2:
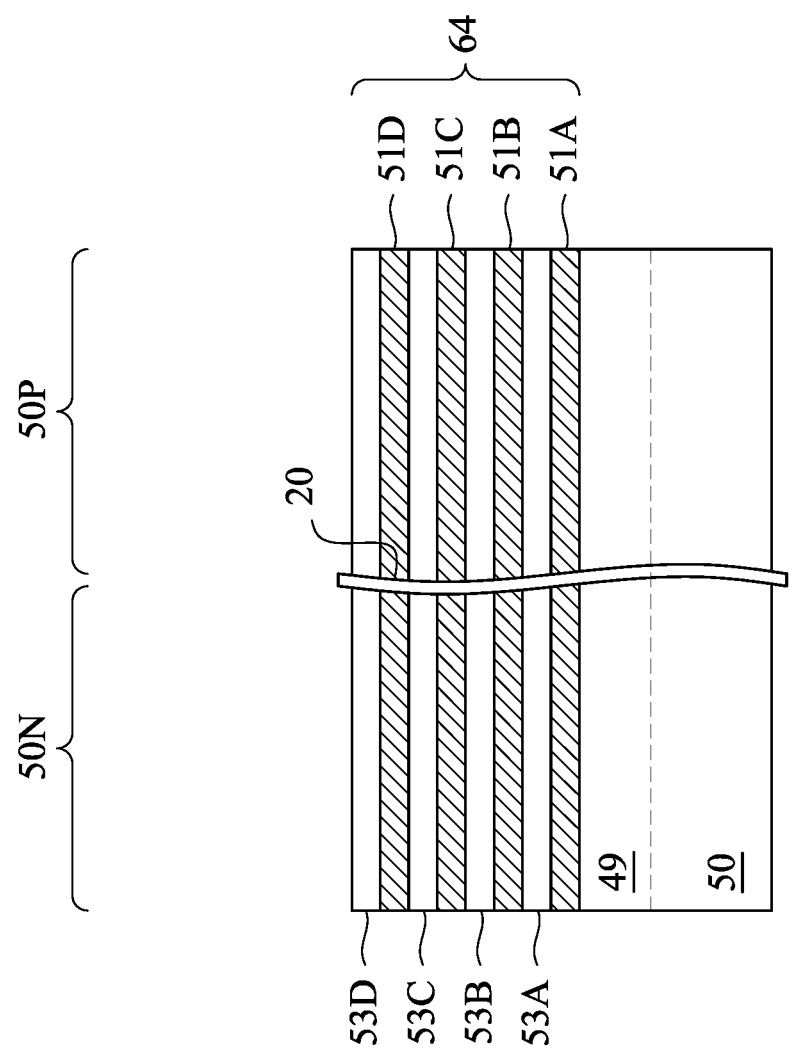
FIGS. 2, 3, 4, 5, 6A, 6B, 6C, 7A, 7B, 7C, 8A, 8B, 8C, 9A, 9B, 9C, 10, 11, 12A, 12B, 12C, 12D, 12E, and 13A are cross-sectional views of intermediate stages in the manufacturing of nano-FETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

The substrate 50 may be lightly doped with a p-type or an n-type impurity. An anti-punch-through (APT) implantation may be performed on an upper portion of the substrate 50 to form an APT region 49. During the APT implantation, dopants may be implanted in the n-type region 50N and the p-type region 50P. The dopants may have a conductivity type opposite a conductivity type of source/drain regions to be formed in each of the n-type region 50N and the p-type region 50P. The APT region 49 may extend under subsequently formed source/drain regions in the resulting nano-FETs, which will be formed in subsequent processes. In some embodiments, the doping concentration in APT region 49 may be from about $5 \times 10^{18}$ atoms/cm$^3$ to about $1 \times 10^{21}$ atoms/cm$^3$. For simplicity and legibility, the APT region 49 may not be illustrated in each of the subsequent drawings.

Further in FIG. 2, a multi-layer stack 64 is formed over the substrate 50. The multi-layer stack 64 includes alternating layers of first semiconductor layers 51A-51D (collectively referred to as first semiconductor layers 51) and second semiconductor layers 53A-53D (collectively referred to as second semiconductor layers 53). For purposes of illustration and as discussed in greater detail below, the first semiconductor layers (which may also referred to as sacrificial layers) 51A, 51B, 51C and 51D will be removed and the second semiconductor layers (which may also referred to as channel layers) 53A, 53B, 53C and 53D will be patterned to form channel regions of nano-FETs in the n-type region 50N and the p-type region 50P. However, in some embodiments the first semiconductor layers 51A, 51B, 51C and 51D may be removed and the second semiconductor layers 53A, 53B, 53C and 53D may be patterned to form channel regions of nano-FETs in the n-type region 50N, and the second semiconductor layers 53A, 53B, 53C and 53D may be removed and the first semiconductor layers 51A, 51B, 51C and 51D may be patterned to form channel regions of nano-FETs in the p-type region 50P. In some embodiments the second semiconductor layers 53A, 53B, 53C and 53D may be removed and the first semiconductor layers 51A, 51B, 51C and 51D may be patterned to form channel regions of nano-FETs in the n-type region 50N, and the first semiconductor layers 51A, 51B, 51C and 51D may be removed and the second semiconductor layers 53A, 53B, 53C and 53D may be patterned to form channel regions of nano-FETs in the p-type region 50P. In some embodiments, the second semiconductor layers 53A, 53B, 53C and 53D may be removed and the first semiconductor layers 51A, 51B, 51C and 51D may be patterned to form channel regions of nano-FETs in both the n-type region 50N and the p-type region 50P.

The multi-layer stack 64 is illustrated as including four layers of the first semiconductor layers 51 and four layers of the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high etch selectivity to one another. As such, the first semiconductor layers 51 of the first semiconductor material may be removed without significantly removing the second semiconductor layers 53 of the second semiconductor material thereby allowing the second semiconductor layers 53A, 53B, 53C and 53D to be patterned to form channel regions of nano-FETs. Similarly, in embodiments in which the second semiconductor layers 53 are removed and the first semiconductor layers 51A, 51B, 51C and 51D are patterned to form channel regions, the second semiconductor layers 53 of the second semiconductor material may be removed without significantly removing the first semiconductor layers 51 of the first semiconductor material, thereby allowing the first semiconductor layers 51A, 51B, 51C and 51D to be patterned to form channel regions of nano-FETs.

Figure 3:
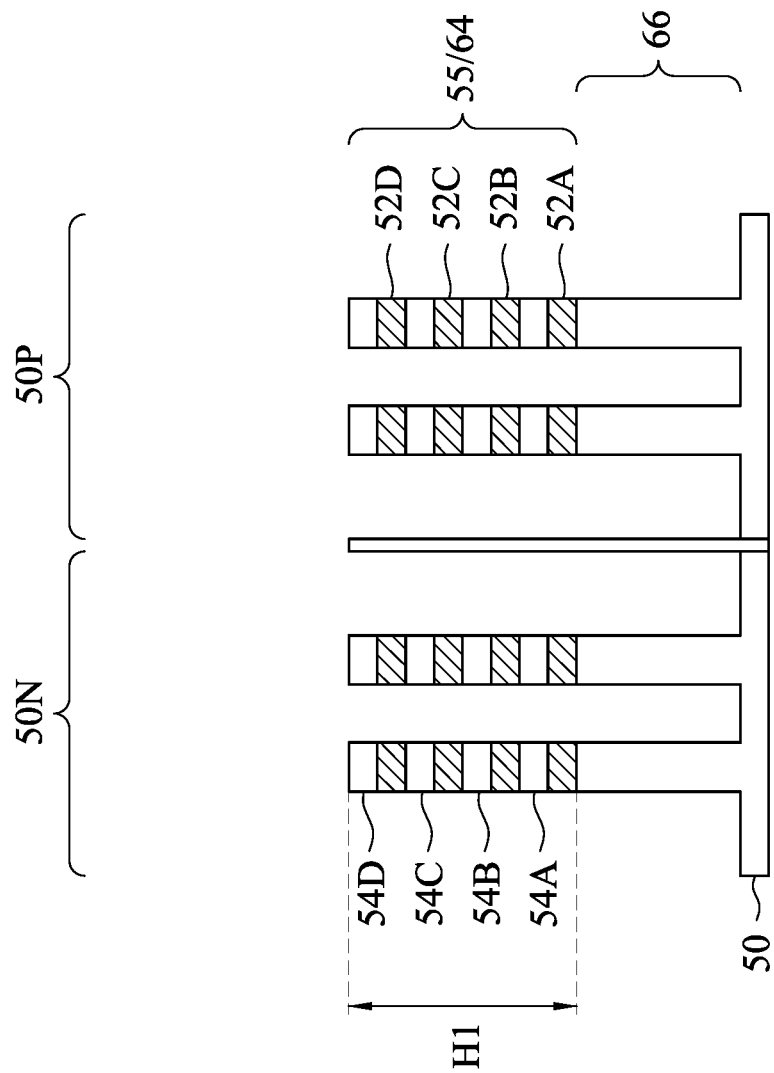

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-52D (collectively referred to as the first nanostructures 52) from the first semiconductor layers 51 and define second nanostructures 54A-54D (collectively referred to as the second nanostructures 54) from the second semiconductor layers 53. The first nanostructures 52 and the second nanostructures 54 may be collectively referred to as nanostructures 55. In an embodiment, a height H1 from a topmost surface of the nanostructures 55 (for example, a top surface of second nanostructure 54D) to a bottommost surface of the nanostructures 55 (for example, a bottom surface of first nanostructure 52A) may be in a range from 40 nm to 60 nm.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
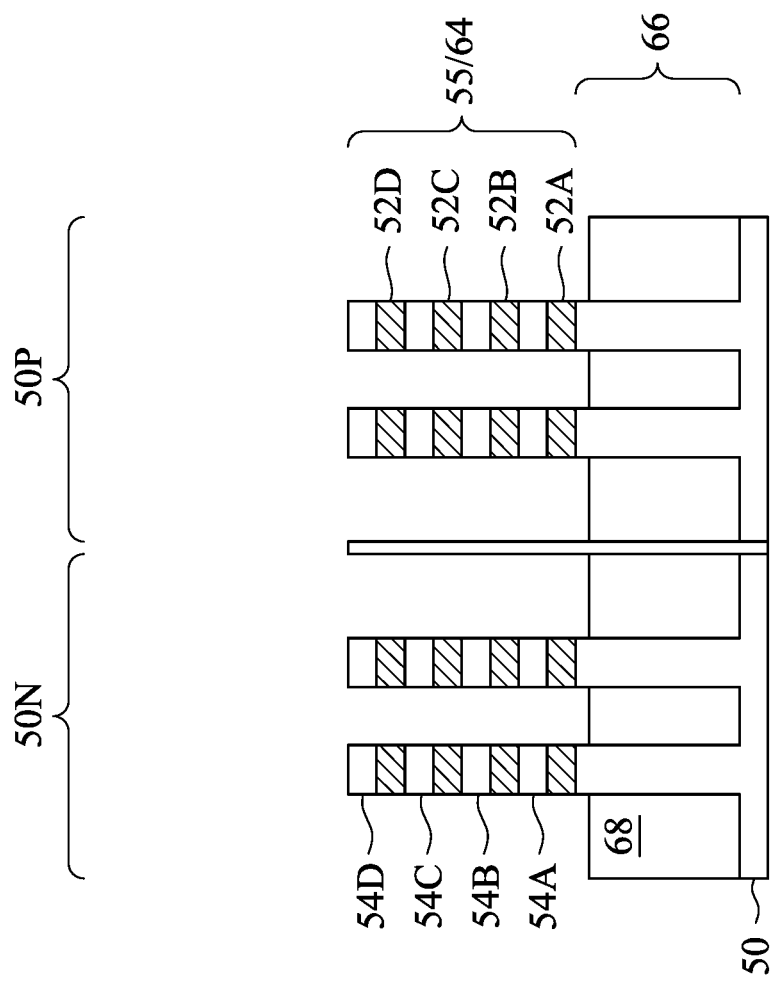

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
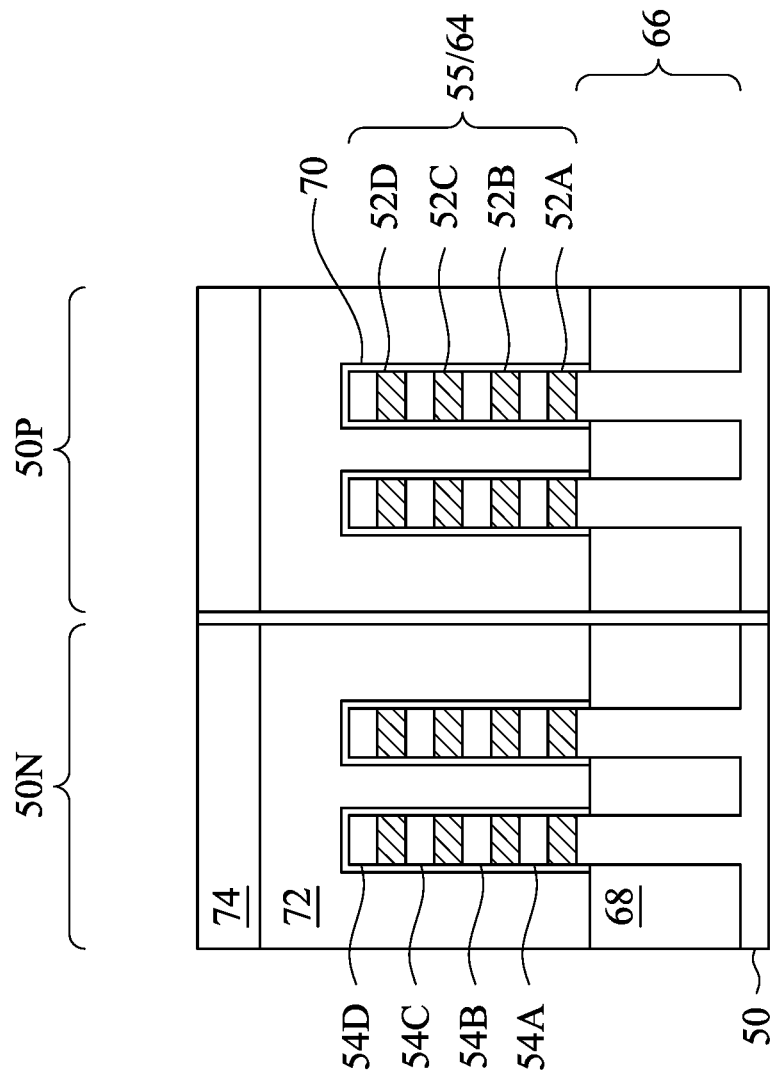

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6B:
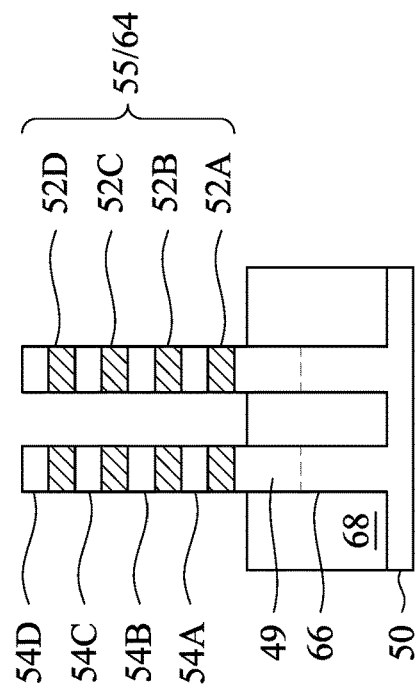
Figure 6A:
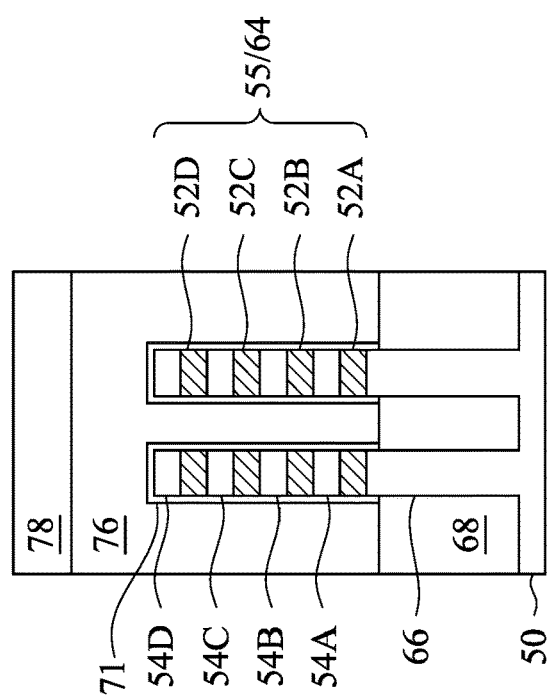
Figure 6C:
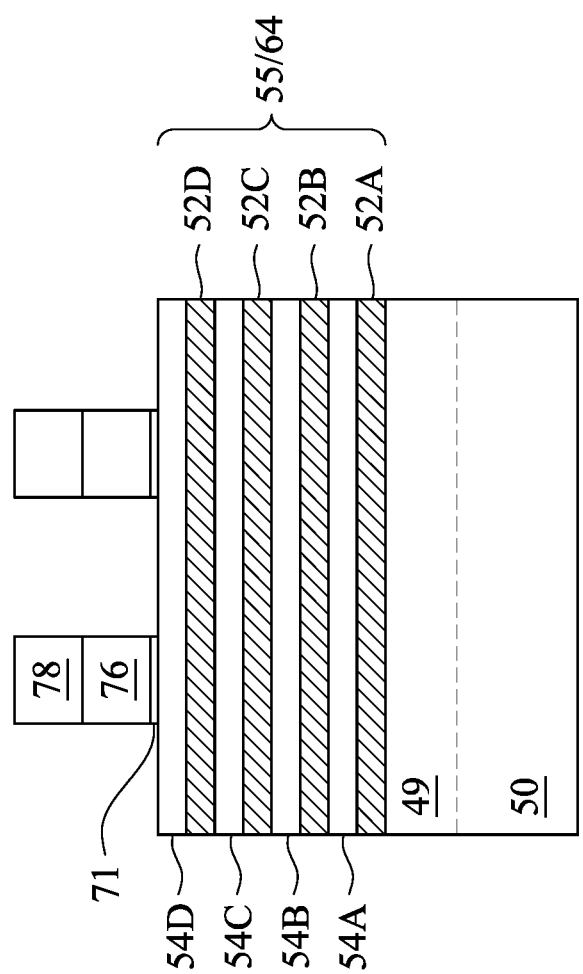

FIGS. 6A through 22B illustrate various additional steps in the manufacturing of embodiment devices. FIGS. 6A through 22B illustrate features in either the n-type region 50N or the p-type region 50P. In FIGS. 6A through 6C, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7B:
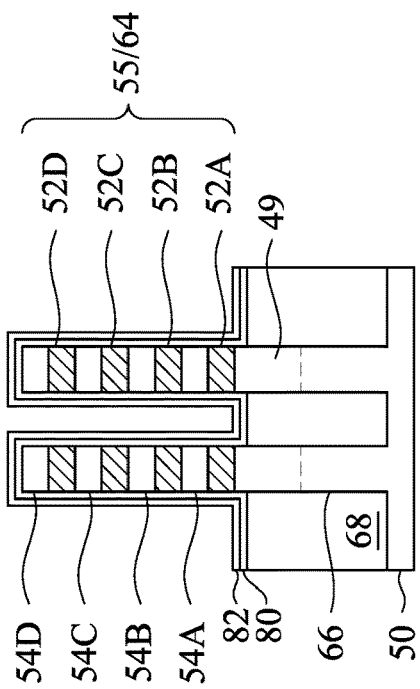
Figure 7A:
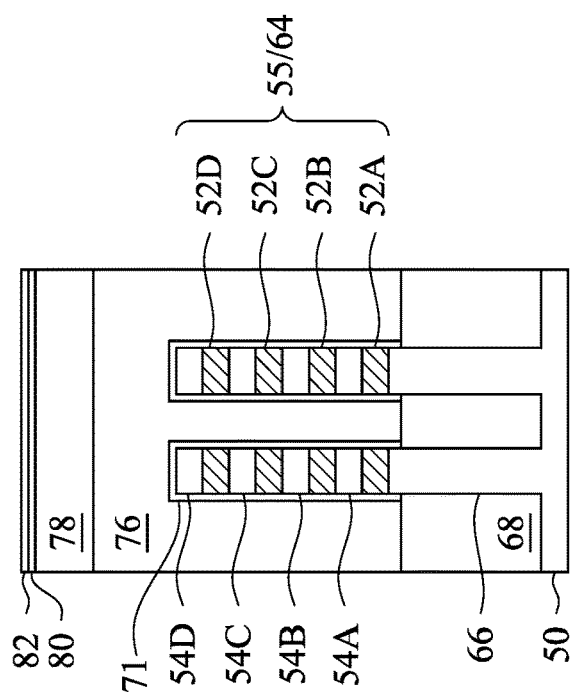
Figure 7C:
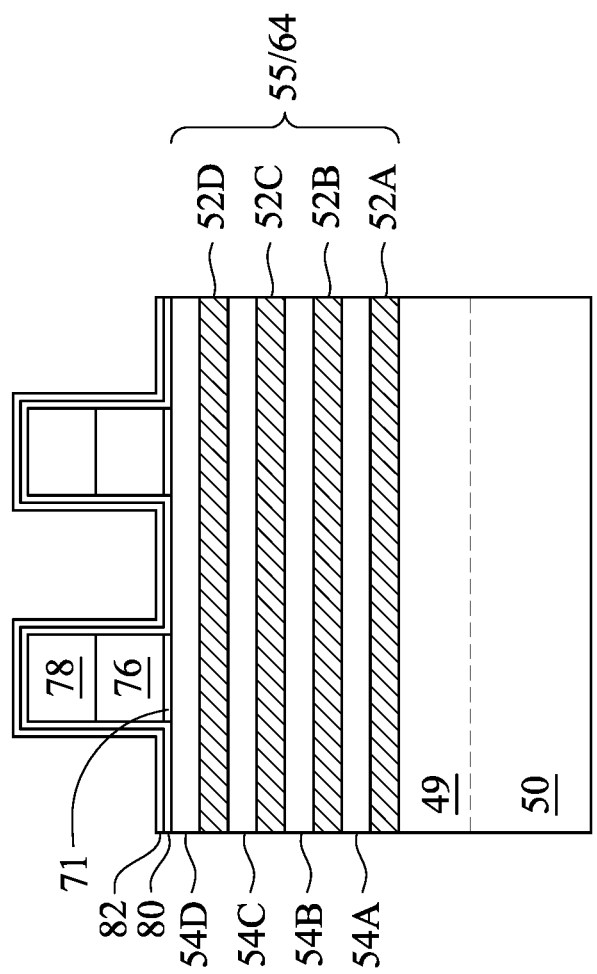

In FIGS. 7A through 7C, a first spacer layer 80 and a second spacer layer 82 are formed over the structures illustrated in FIGS. 6A through 6C. The first spacer layer 80 and the second spacer layer 82 will be subsequently patterned to act as spacers for forming self-aligned source/drain regions. In FIGS. 7A through 7C, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed.

Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8B:
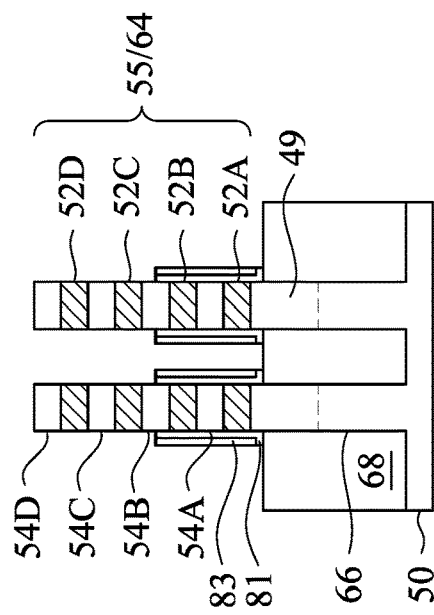
Figure 8A:
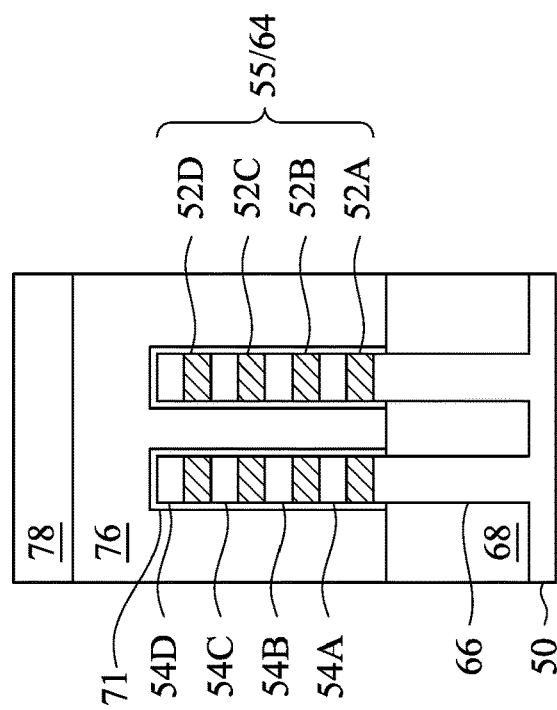
Figure 8C:
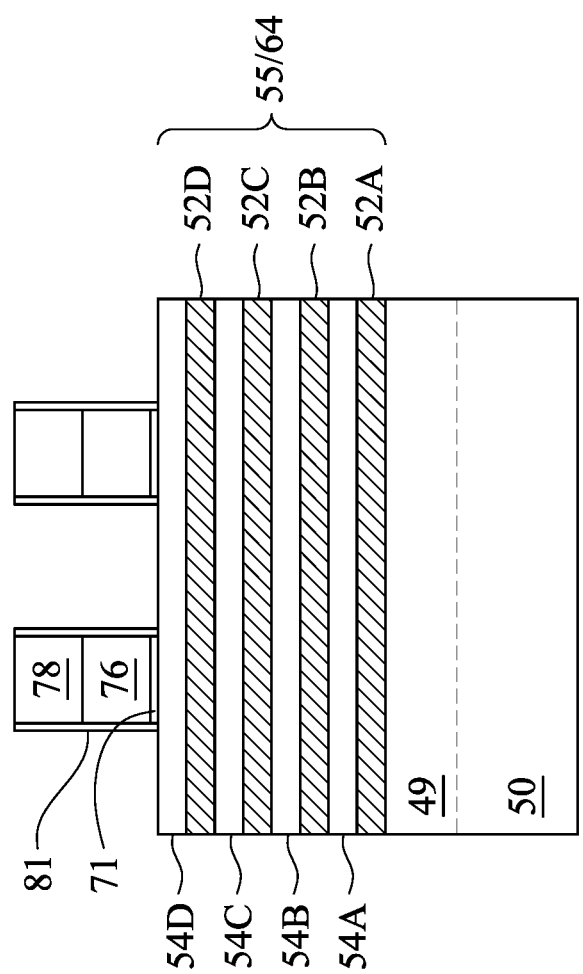

In FIGS. 8A through 8C, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8B. Thereafter, the second spacers 83 acts as a mask while etching exposed portions of the first spacer layer 80, thereby forming first spacers 81 as illustrated in FIG. 8B and 8C.

As illustrated in FIG. 8B, the first spacers 81 and the second spacers 83 are disposed on sidewalls of the fins 66 and/or nanostructures 55. As illustrated in FIG. 8C, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9B:
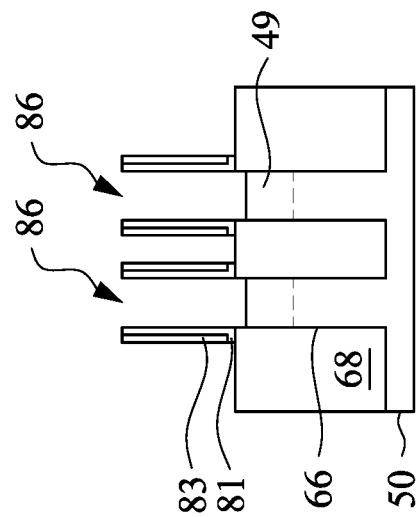
Figure 9A:
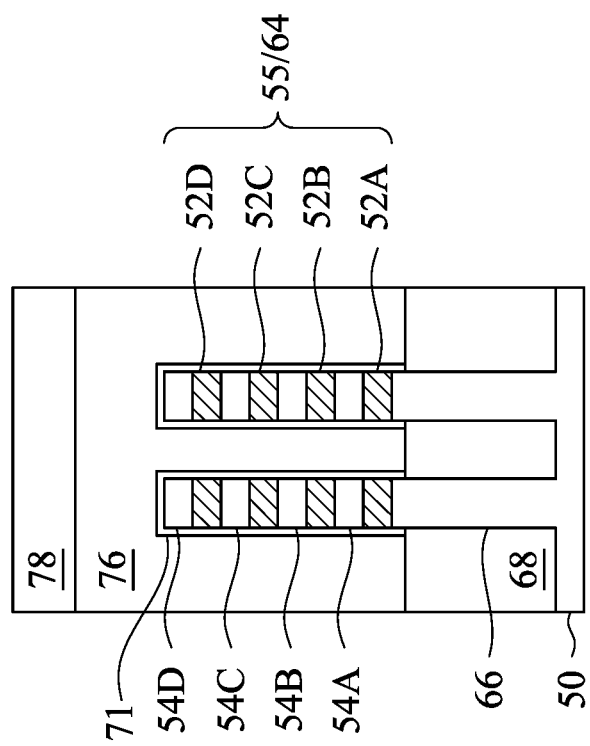
Figure 9C:
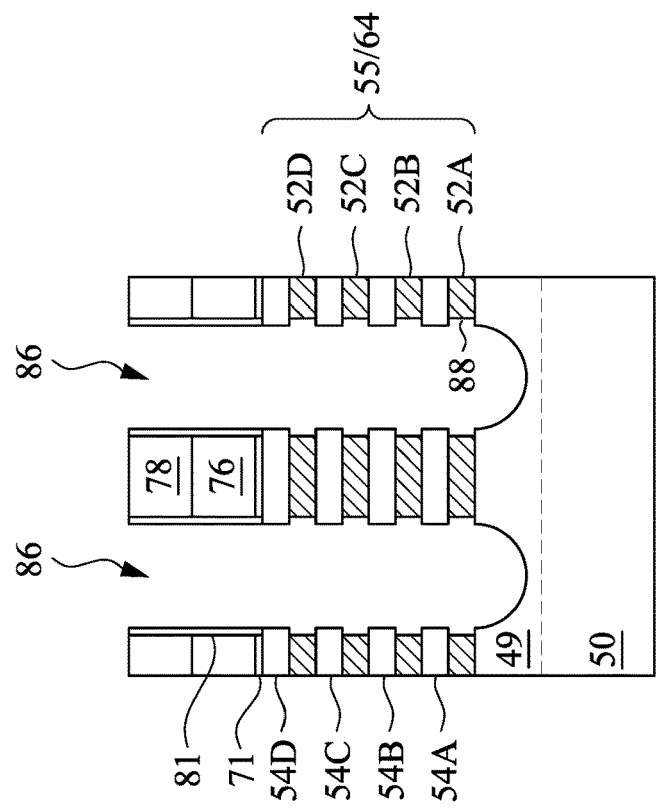

In FIGS. 9A through 9C, first recesses 86 are formed in the nanostructures 55 and the fins 66, in accordance with some embodiments. Epitaxial materials and epitaxial source/drain regions will be subsequently formed in the first recesses 86. The first recesses 86 may extend through the first nanostructures 52, the second nanostructures 54, and partially through the fins 66. In an embodiment, the first recesses 86 may extend partially into the APT region 49 as illustrated in FIG. 9C. In other embodiments, the first recesses 86 may extend through the APT region 49 and may further extend partially through the substrate 50. In an embodiment, the nanostructures 55 and the fins 66 may be etched such that bottom surfaces of the first recesses 86 are disposed below the top surfaces of the STI regions 68 or the like as illustrated by FIG. 9B. In other embodiments, top surfaces of the STI regions 68 may be level with bottom surfaces of the first recesses 86.

The first recesses 86 may be formed by etching the nanostructures 55 and the fins 66 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55. Timed etch processes may be used to stop the etching after the first recesses 86 reach desired depths.

Figure 10:
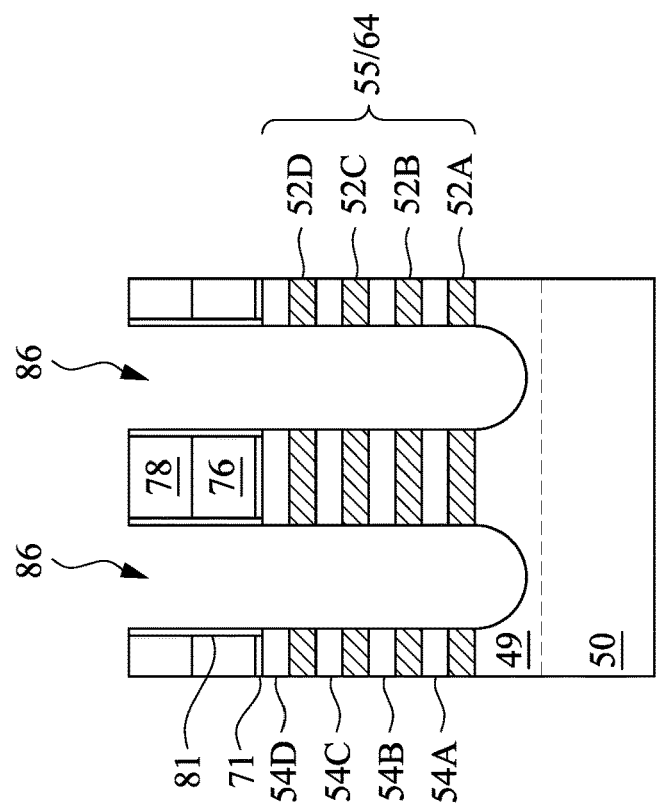

In FIG. 10, portions of sidewalls of the layers of the multi-layer stack 64 formed of the first semiconductor materials (e.g., the first nanostructures 52) exposed by the first recesses 86 are etched to form sidewall recesses 88. Although sidewalls of the first nanostructures 52 adjacent the sidewall recesses 88 are illustrated as being straight in FIG. 10, the sidewalls may be concave or convex. The sidewalls may be etched using isotropic etching processes, such as wet etching or the like. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52.

Figure 11:
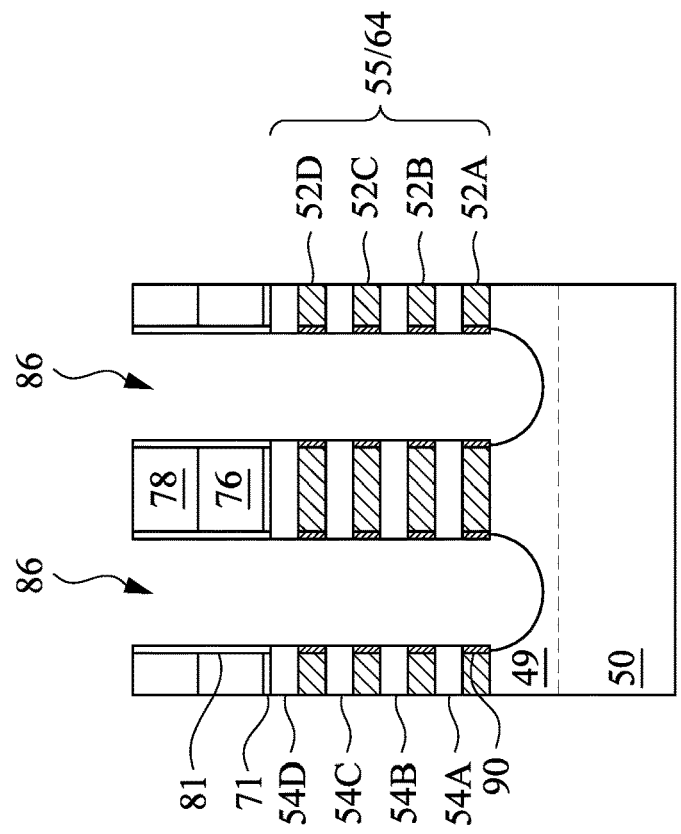

In FIG. 11, inner spacers 90 are formed in the sidewall recess 88. The inner spacers 90 may be formed by depositing an inner spacer layer (not separately illustrated) over the structures illustrated in FIG. 10. The inner spacers 90 act as isolation features between subsequently formed source/drain regions and the gate dielectric layers 120 and the gate electrodes 102 (shown subsequently in FIGS. 19A and 19B). As will be discussed in greater detail below, epitaxial source/drain regions and epitaxial materials will be formed in the first recesses 86, while the first nanostructures 52A, 52B, 52C and 52D will be replaced with the gate dielectric layers 120 and the gate electrodes 102.

The inner spacer layer may be deposited by a conformal deposition process, such as CVD, ALD, or the like. The inner spacer layer may comprise a material such as silicon carbonitride (SiCN) or silicon oxycarbonitride (SiOCN). In other embodiments, silicon nitride or silicon oxynitride, or any suitable material, such as low-dielectric constant (low-k) materials having a k-value less than about 3.5, may be utilized. The inner spacer layer may then be anisotropically etched to form the inner spacers 90. Although outer sidewalls of the inner spacers 90 are illustrated as being flush with sidewalls of the second nanostructures 54, the outer sidewalls of the inner spacers 90 may extend beyond or be recessed from sidewalls of the second nanostructures 54. Moreover, although the outer sidewalls of the inner spacers 90 are illustrated as being straight in FIG. 11, the outer sidewalls of the inner spacers 90 may be concave or convex. The inner spacer layer may be etched by an anisotropic etching process, such as RIE, NBE, or the like. The inner spacers 90 may be used to prevent damage to subsequently formed source/drain regions (shown in FIGS. 14A through 14D) by subsequent etching processes, such as etching processes used to form the gate dielectric layers 120 and the gate electrodes 102 (shown in FIGS. 19A and 19B).

Figure 12A:
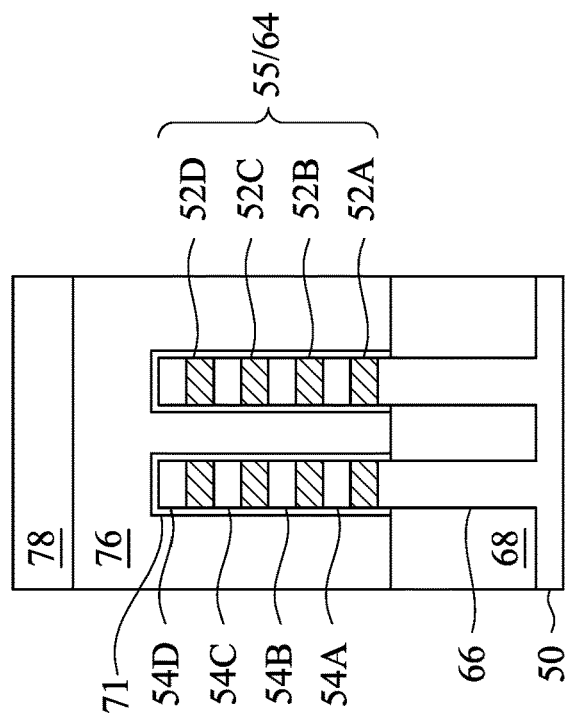
Figure 12C:
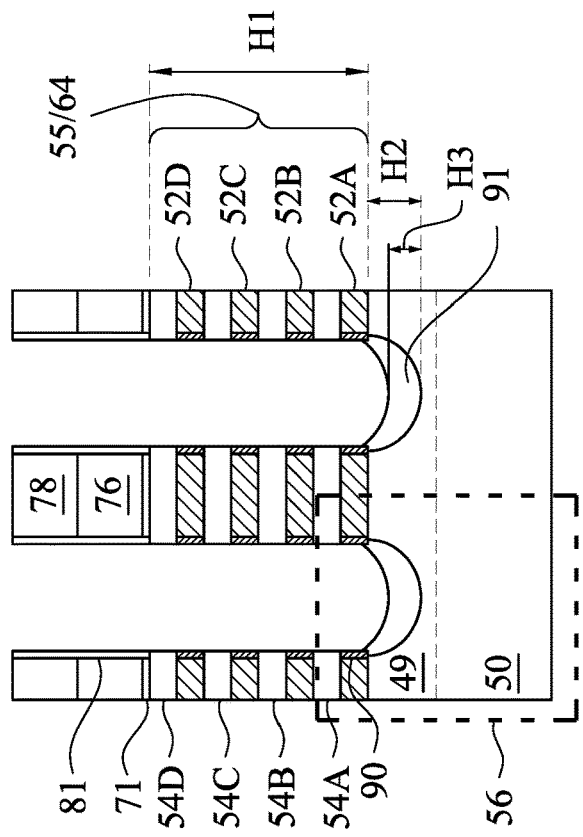
Figure 12B:
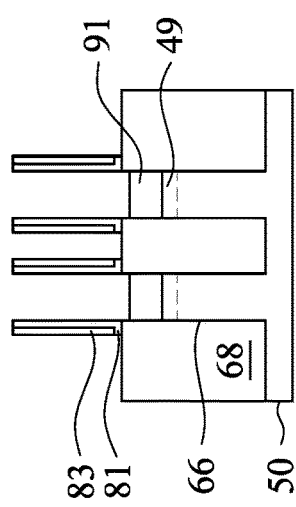

In FIGS. 12A through 12C, first epitaxial material 91 is formed in the first recesses 86. The first epitaxial material 91 were epitaxially grown using a process such as chemical vapor deposition (CVD), atomic layer deposition (ALD), vapor phase epitaxy (VPE), molecular beam epitaxy (MBE), or the like. Tuning of the parameters of the epitaxial growth process allows for bottom-up growth of the first epitaxial material 91 in the first recesses 86, such that growth of the first epitaxial material 91 takes place at bottom portions of the first recesses 86 before other portions of the first recesses 86. In an embodiment, minimal or minor growth of the first epitaxial material 91 may grow on the second nanostructures 54A-54D. However, this minimal or minor growth may be less than the amount of bottom-up growth in the first recesses 86. Tuning the parameters of the epitaxial growth process may include tuning gas flows and/or chamber temperature during the epitaxial growth process. The first epitaxial material 91 may comprise undoped silicon, or the like, and may be formed to fill a bottom portion of the first recesses 86 that is disposed in the APT region 49. For example, the first epitaxial material 91 may be disposed between the APT region 49/substrate 50 and subsequently formed epitaxial source/drain regions 92 (shown in FIGS. 14A through 14D). During the formation of the first epitaxial material 91, no in-situ doping is performed and as a result, no dopants are present in the first epitaxial material 91.

Referring further to FIGS. 12A through 12C, the first epitaxial material 91 may have a curved top surface. In the illustrated embodiment, the first epitaxial material 91 may have a curved top surface with a concave profile and a curved bottom surface with a convex profile. In the illustrated embodiment, the first epitaxial material 91 may be in physical contact with a bottom surface and sidewalls of the inner spacers 90. In an embodiment, the first epitaxial material 91 may have a curved top surface that continuously curves from a first sidewall of a first inner spacer 90 to a second sidewall of a second inner spacer 90. In an embodiment, the first epitaxial material 91 may have a curved bottom surface that continuously curves from a first bottom surface of the first inner spacer 90 to a second bottom surface of the second inner spacer 90. In an embodiment, a second height H2 from a bottommost point of the nanostructures 55 to a bottommost point of the first epitaxial material 91 may be in a range from 15 nm to 25 nm. In an embodiment, a third height H3 from the bottommost point of a top surface of the first epitaxial material 91 to a bottommost point of the first epitaxial material 91 may be in a range from 15 nm to 25 nm. As shown in FIG. 12C, the bottommost point of a top surface of the first epitaxial material 91 is lower than the bottommost surface of the nanostructures 55 (for example, the bottom surface of 52A In an embodiment, the entirety of a bottom surface of the first epitaxial material 91 may be in physical contact with the APT region 49. In an embodiment, a portion of the bottom surface of the first epitaxial material 91 may be in physical contact with the APT region 49. In other embodiments, as shown in FIG. 12D, the bottommost point of a top surface of the first epitaxial material 91 is at the same level as the bottommost surface of the nanostructures 55 (for example, the bottom surface of 52A). In the embodiment of FIG. 12D, a fourth height H4 from the bottommost point of a top surface of the first epitaxial material 91 to a bottommost point of the first epitaxial material 91 is equal to the second Height H2. An advantageous feature of the embodiment of FIG. 12D is that a larger volume of the first epitaxial material 91 may be disposed between the APT region 49/substrate 50 and subsequently formed epitaxial source/drain regions 92 (shown in FIGS. 14A through 14D). This prevents the subsequently formed epitaxial source/drain regions 92 from being formed lower than a topmost surface of the APT region 49 and results in improved reduction of the enlarged electric field that forms as result of the APT implantation, and the improved mitigation of the junction leakage current ($Ib_{off}$).

Figure 12E:
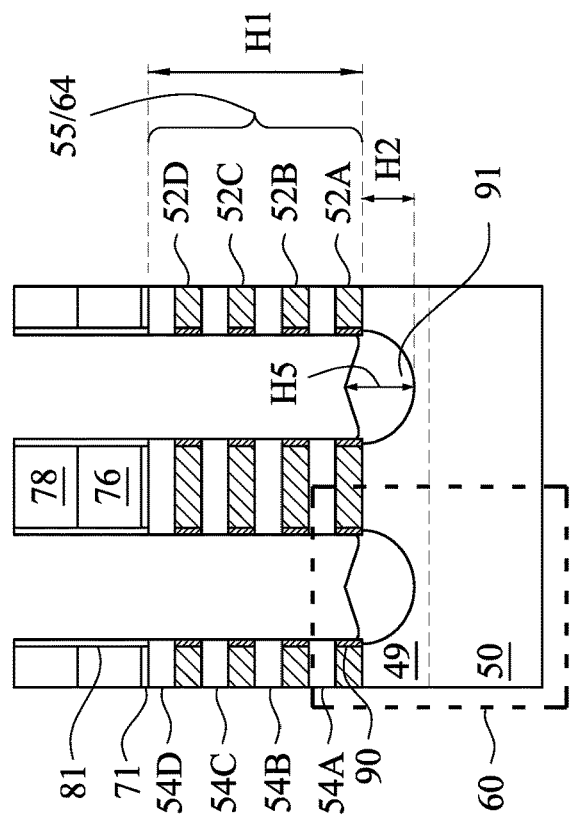
Figure 12D:
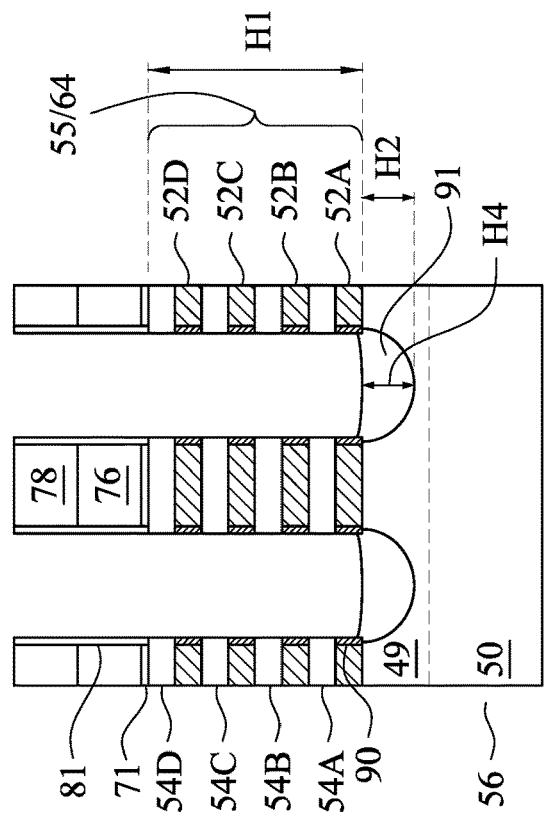

FIG. 12E illustrates an alternative embodiment. Unless specified otherwise, like reference numerals in this embodiment (and subsequently discussed embodiments) represent like components in the embodiment shown in FIGS. 1 through 12D formed by like processes. Accordingly, the process steps and applicable materials may not be repeated herein. The initial steps of this embodiment are essentially the same as shown in FIGS. 1 through 11.

Referring further to FIG. 12E in an embodiment, the first epitaxial material 91 may have a curved top surface. In an embodiment, a portion of a top surface of the first epitaxial material 91 may have a curved top surface that has a convex profile. In an embodiment, a portion of a top surface of the first epitaxial material 91 may have a curved top surface that has a convex profile, while remaining portions of the top surface of the first epitaxial material 91 may have curved top surfaces that have concave profiles. In an embodiment, the first epitaxial material 91 may have a curved bottom surface that has a convex profile. In an embodiment, the first epitaxial material 91 may be in physical contact with a bottom surface and sidewall of the inner spacers 90. In an embodiment, the first epitaxial material 91 may have a top surface that curves from a first sidewall of a inner spacer 90 to a second sidewall of a different inner spacer 90. In an embodiment, the first epitaxial material 91 may have a curved bottom surface that continuously curves from a first bottom surface of a inner spacer 90 to a second bottom surface of a different inner spacer 90. In an embodiment, the second height H2 from a bottommost surface of the nanostructures 55 (for example, first nanostructure 52A) to a bottommost point of the first epitaxial material 91 may be in a range from 15 nm to 25 nm. In an embodiment, a fifth height H5 from a topmost point of a top surface of the first epitaxial material 91 to a bottommost point of the first epitaxial material 91 may be in a range from 25 nm to 35 nm. In an embodiment, the topmost point of a top surface of the first epitaxial material 91 is higher than the bottommost surface of the nanostructures 55 (for example, first nanostructure 52A). In an embodiment, the topmost point of a top surface of the first epitaxial material 91 is located at a central or middle point of the top surface of the first epitaxial material 91. As shown in FIG. 12E, in an embodiment, the entirety of a bottom surface of the first epitaxial material 91 may be in physical contact with the APT region 49. In other embodiments, a portion of the bottom surface of the first epitaxial material 91 may be in physical contact with the APT region 49. An advantageous feature of the embodiment of FIG. 12E is that a larger volume of the first epitaxial material 91 is formed in the first recesses 86. After subsequently formed epitaxial source/drain regions 92 (shown in FIGS. 14A through 14D) are formed over the first epitaxial material 91, a process of forming a first interlayer dielectric (ILD) 96 (shown in FIGS. 15A and 15B) over the epitaxial source/drain regions 92, and in between adjacent masks 78 and adjacent dummy gates 76 is simplified.

Figure 13B:
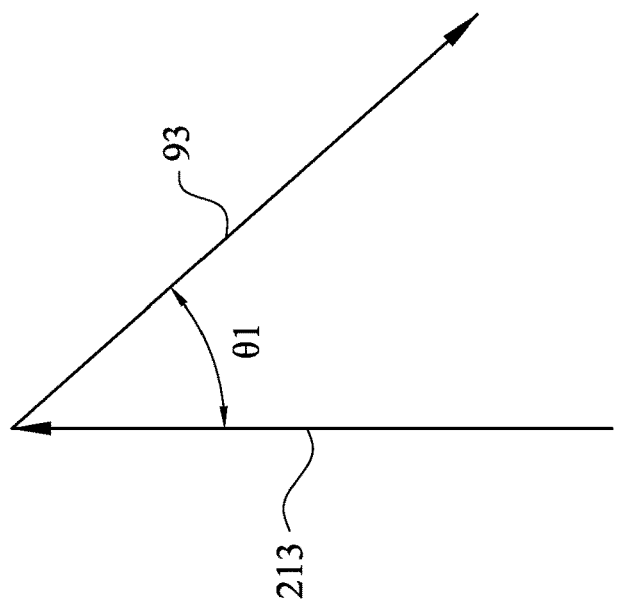
FIGS. 13B and 13C illustrates an implantation process 93 used to direct an implantation species or dopants.
Figure 13A:
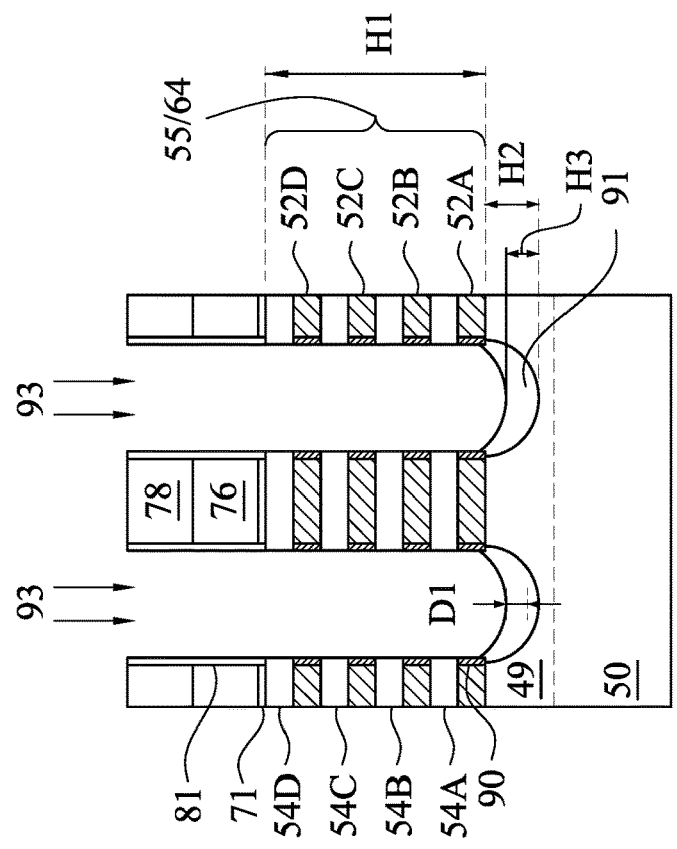
Figure 13C:
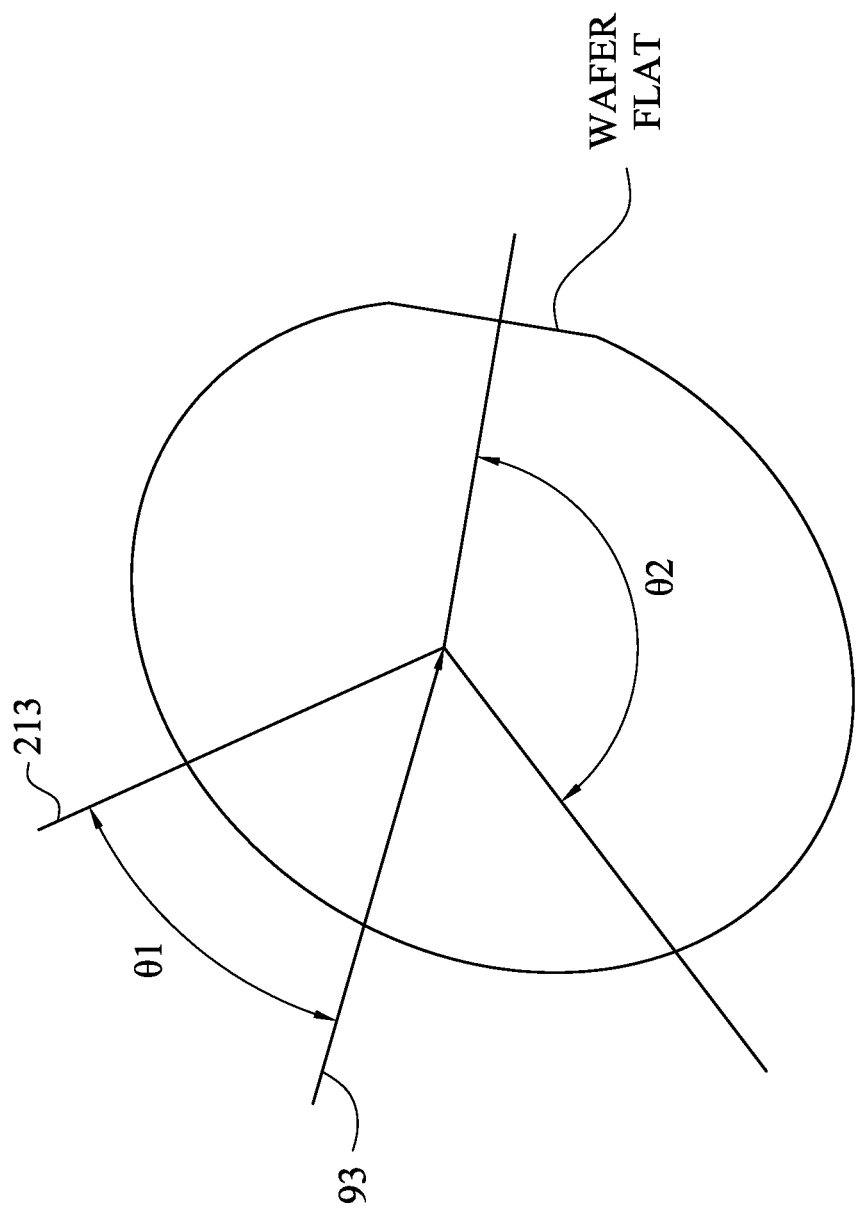

In FIG. 13A, an implantation process 93 is performed on the first epitaxial material 91 to introduce dopants into the first epitaxial material 91. The implantation process 93 is used to create a gradient-doped profile in the first epitaxial material 91 and may be performed using a high current ion implanter, or the like. In the implantation process 93, implantation species (or dopants) are introduced using various ion species that are ionized and accelerated to impact into the first epitaxial material 91 using a number of ion beams. This will result in thousand of atoms of the first epitaxial material 91 (e.g., silicon) being displaced from each ion implant, and the subsequent distribution of dopants within the first epitaxial material 91. By varying the energies and the doses of the number of ion beams, a gradient-doped profile in the first epitaxial material 91 can be formed. Although the implantation process 93 in FIG. 13A is shown as being performed on the structure illustrated in FIGS. 12A through 12C, the implantation process 93, subsequent processes, and applicable materials may be applicable to any of the embodiments shown in FIGS. 12A through 12E. As shown in FIG. 13B, the implantation process 93 may direct the implantation species (or dopants) at a tilt angle θ1 with respect to the axis 213 perpendicular to the major surface of the substrate 50 (which may be for example, a wafer). In some embodiments, the tilt angle θ1 may be in a range from 0° to 15°. As shown in FIG. 13C, the implantation process 93 may direct an implantation species at a twist (also referred to as a rotation) angle θ2 that specifies the angle between a wafer notch or flat (for example, when the substrate 50 is the wafer) and the vector formed by the projection of the ion beam direction vector on to the wafer. In some embodiments, the twist/rotation angle θ2 may be in a range from 0° to 360°.

In various embodiments, the implantation species may include ions formed from, arsenic (As), phosphorous (P), antimony (Sb), boron di-fluoride ($BF_2$), boron (B), combinations thereof, or the like. In an embodiment, the implantation process 93 introduces dopants derived from arsenic (As) and/or phosphorous (P) into the first epitaxial material 91 in the n-type region 50N, e.g., the NMOS region. In an embodiment, the implantation process 93 introduces dopants derived from antimony (Sb), boron di-fluoride (BF2) and/or boron (B) into the first epitaxial material 91 in the p-type region 50P, e.g., the PMOS region. The implantation process 93 introduces dopants into the first epitaxial material 91 that have a conductivity type opposite to a conductivity type of the APT region 49. The implantation species may be delivered using an ion beam such that after the implantation process 93, a dopant concentration of the implanted dopants in the first epitaxial material 91 is in the range from $1 \times 10^{17}$ atoms/$cm^3$ to $1 \times 10^{20}$ atoms/$cm^3$ and the first epitaxial material 91 has a gradient-doped profile. The first epitaxial material 91 has a dopant concentration that is lower than a dopant concentration of subsequently formed epitaxial source/drain regions 92 (shown in FIGS. 14A through 14D).

Figure 13D:
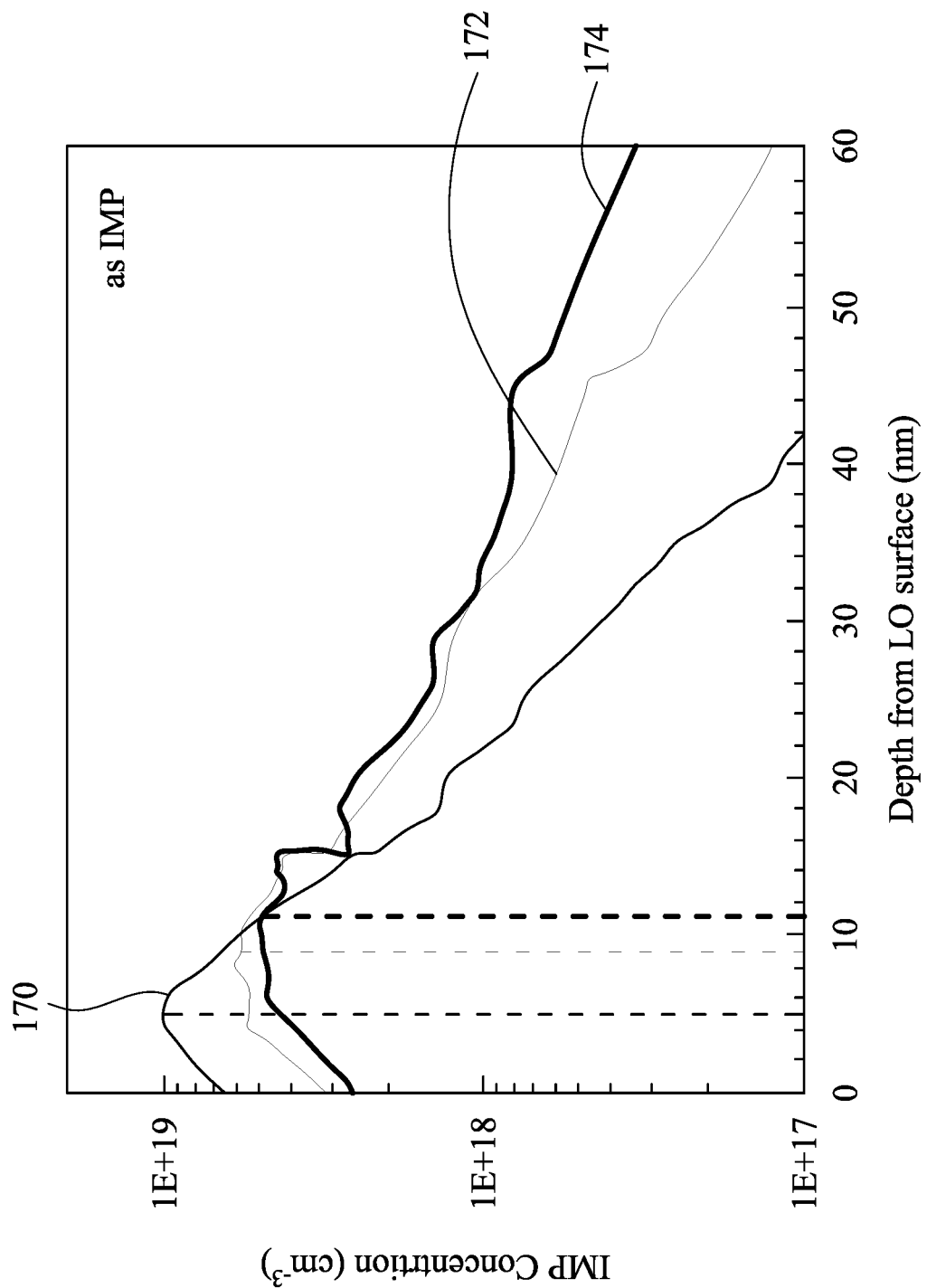
FIG. 13D illustrates traces of dopant concentration versus implant depth for example implantation processes 93 using ion beams with different energies.

In an embodiment, the first epitaxial material 91 may have a peak dopant concentration value that is in a range from $1 \times 10^{20}$ atoms/$cm^3$ to $5 \times 10^{20}$ atoms/$cm^3$, at a depth D1 that is in a range from 15 nm to 30 nm below a top surface of first epitaxial material 91. Therefore, the dopant concentration of the first epitaxial material 91 may increase from a top surface of the first epitaxial material 91 in a direction towards a bottom surface of the substrate 50 until the depth D1. Below the depth D1, the dopant concentration of the first epitaxial material 91 may decrease from the peak dopant concentration value in a direction towards a bottom surface of the substrate 50. For example, FIG. 13D shows traces of dopant concentration versus implant depth for example implantation processes 93 using ion beams with different energies. The traces 170, 172 and 174 indicate implantation processes 93 using ion beams with increasing energies. In FIG. 13D, the example traces 170, 172 and 174 may indicate implantation processes using ion beams having energies of 3 keV, 5 keV and 7 keV, respectively. Other implantation energies are also possible in other embodiments. The example traces 170, 172 and 174 may have peak dopant concentration values of $1 \times 10^{19}$ atoms/$cm^3$, $6 \times 10^{18}$ atoms/$cm^3$ and $5 \times 10^{18}$ atoms/$cm^3$, respectively. The example traces 170, 172 and 174 may have peak dopant concentration values at a depth D1 of 5 nm, 9 nm and 11 nm, respectively, below a top surface of the first epitaxial material 91.

Advantages can be achieved as a result of the dopant concentration of the implanted dopants in the gradient-doped first epitaxial material 91 being in the range from a lower threshold limit of $1 \times 10^{17}$ atoms/$cm^3$ to an upper threshold limit $1 \times 10^{20}$ atoms/$cm^3$ and being lower than a dopant concentration of the subsequently formed epitaxial source/drain regions 92. These advantages include a reduction of the enlarged electric field that forms as result of the APT implantation shown previously in FIG. 2, and further results in the mitigation of the junction leakage current ($Ib_{off}$) caused by the enlarged electric field. For example, a dopant concentration of the implanted dopants in the gradient-doped first epitaxial material 91 being higher than the upper threshold limit $1 \times 10^{20}$ atoms/$cm^3$ would result in inadequate electric field reduction and therefore higher junction leakage current ($Ib_{off}$), and a dopant concentration of the implanted dopants in the gradient-doped first epitaxial material 91 being lower than the lower threshold limit $1 \times 10^{17}$ atoms/$cm^3$ would result in only minimal or minor electric field reduction and consequently minimal mitigation of the junction leakage current ($Ib_{off}$).

In an embodiment, the implantation process 93 may be performed at a temperature that is in a range from −60° C. to 450° C. In an embodiment, when the implantation species includes ions formed from arsenic (As), the implantation species may be delivered using an ion beam having an energy that is in a range from 3 keV to 38 keV. In an embodiment, when the implantation species includes ions formed from phosphorous (P), the implantation species may be delivered using an ion beam having an energy that is in a range from 2 keV to 23 keV. In an embodiment, when the implantation species includes ions formed from antimony (Sb), the implantation species may be delivered using an ion beam having an energy that is in a range from 8 keV to 92 keV. In an embodiment, when the implantation species includes ions formed from boron di-fluoride (BF2), the implantation species may be delivered using an ion beam having an energy that is in a range from 3 keV to 24 keV. In an embodiment, when the implantation species includes ions formed from boron (B), the implantation species may be delivered using an ion beam having an energy that is in a range from 1 keV to 8 keV. In an embodiment, the implantation species (dopants) may be delivered using an ion beam having a dose that is in a range from $5 \times 10^{13}$ atoms/$cm^2$ to $1 \times 10^{15}$ atoms/$cm^2$. Performing the implantation process 93 using an ion beam having an energy that is larger than the range of energies described above, or using an ion beam having a dose that is larger than the range of doses described above may lead to short channel effects and gate induced drain leakage that negatively affect device performance. Performing the implantation process 93 using an ion beam having an energy that is lower than the range of energies described above, or using an ion beam having a dose that is lower than the range of doses described above may lead to insufficient mitigation of the junction leakage current ($I_{boff}$), which will reduce to reduced device performance.

Figure 13F:
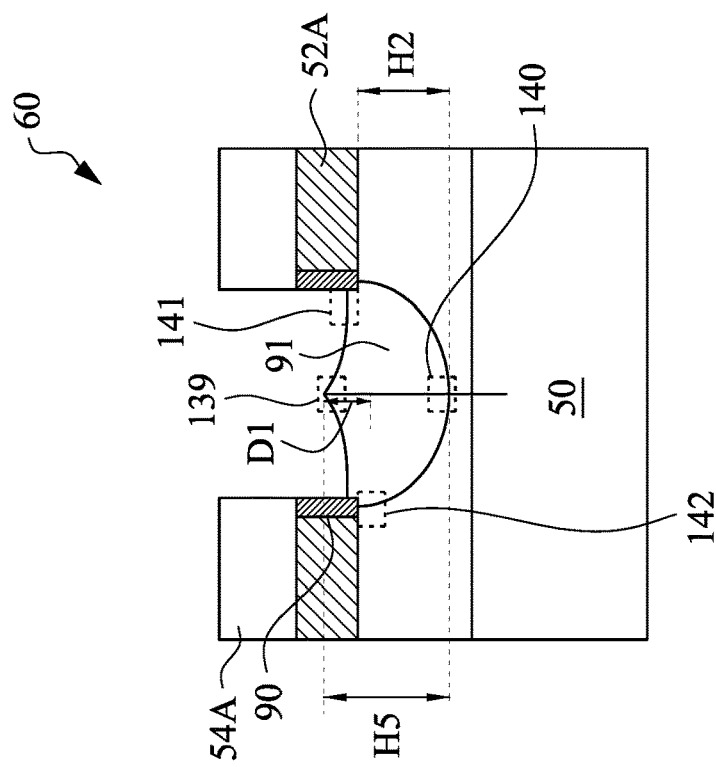
FIGS. 13E, 13F, 14A, 14B, 14C, 14D, 15A, 15B, 16A, 16B, 17A, 17B, 18A, 18B, 19A, 19B, 20A, 20B, 20C, 20D, 21A, 21B, 22A and 22B are cross-sectional views of intermediate stages in the manufacturing of nano-FETs, in accordance with some embodiments.
Figure 13E:
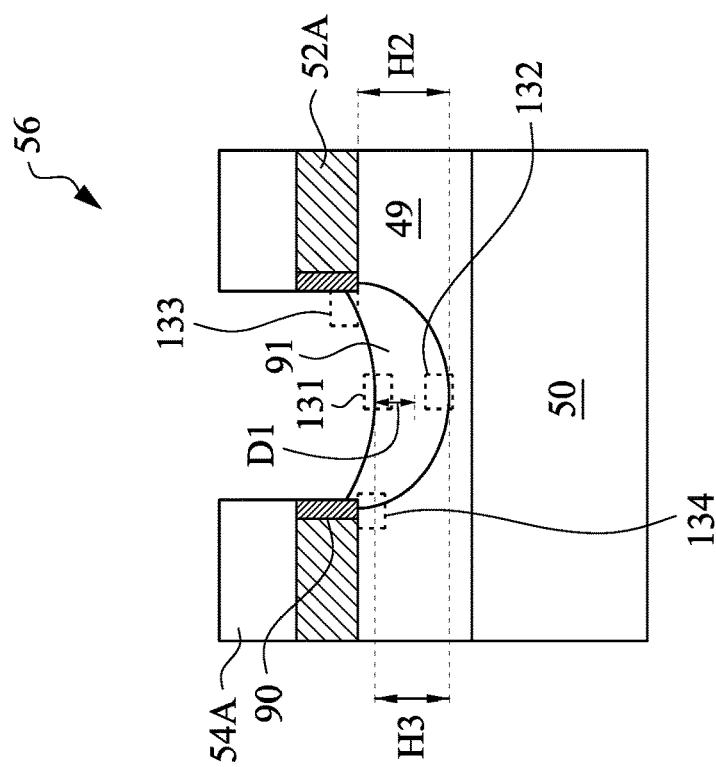

FIG. 13E and 13F illustrate the regions 56/60 of the embodiments shown in FIGS. 12A through 12E, after the implantation process 93 is performed on the first epitaxial material 91. The first epitaxial material 91 may have a gradient-doped profile after the implantation process 93 such that a dopant concentration of the first epitaxial material 91 increases from a top surface of the first epitaxial material 91 in a direction towards a bottom surface of the substrate 50 up to the depth D1. Below the depth D1, the dopant concentration of the first epitaxial material 91 decreases in a direction towards a bottom surface of the substrate 50. For example, as shown in FIG. 13E, a dopant concentration in a region 131 at a top surface of the first epitaxial material 91 may be higher than a dopant concentration of other, underlying regions (for example, region 132) of the first epitaxial material 91 that are below the depth D1 of the first epitaxial material 91. In another example, as shown in FIG. 13F, the topmost point of a top surface of the first epitaxial material 91 is located at a central or middle point of the top surface of the first epitaxial material 91, and a dopant concentration in a region 139 at a top surface of the first epitaxial material 91 may be higher than a dopant concentration of other, underlying regions (for example, region 140) of the first epitaxial material 91 that are below the depth D1 of the first epitaxial material. In addition, regions of the first epitaxial material 91 along a sidewall of an inner spacer 90 (for example, in regions 133/141) may have a higher dopant concentration than regions of the first epitaxial material 91 that are under the inner spacer 90 (for example, in region 134/142). In the embodiments shown in FIGS. 13E and FIG. 13F, after the implantation process 93, the inner spacers 90 may have a dopant concentration lower than $1 \times 10^{17}$ atoms/$cm^3$.

Advantages can be achieved as a result of performing an anti-punch-through (APT) implantation on an upper portion of the fin 66, followed by forming nanostructures 55 over the fin 66. First recesses 86 are formed in the nanostructures 55 and the fin 66. Subsequently, the first epitaxial material 91 (for example, an undoped silicon layer) is formed in the first recesses 86. An implantation process 93 is performed on the first epitaxial material 91 such that the first epitaxial material 91 has a gradient-doped profile. Source/drain regions 92 are then formed in the first recesses 86 over the first epitaxial material 91. These advantages include a reduction of the enlarged electric field that forms as result of the APT implantation, and therefore the mitigation of the junction leakage current ($Ib_{off}$) caused by the enlarged electric field. In addition, the disclosed embodiments lead to improved device performance as the junction leakage current may be reduced by an order of magnitude that is in a range from 1 to 2. Further, the disclosed method is may be integrated easily into existing processes and provides a solution to junction leakage current with lower manufacturing costs.

Figure 14B:
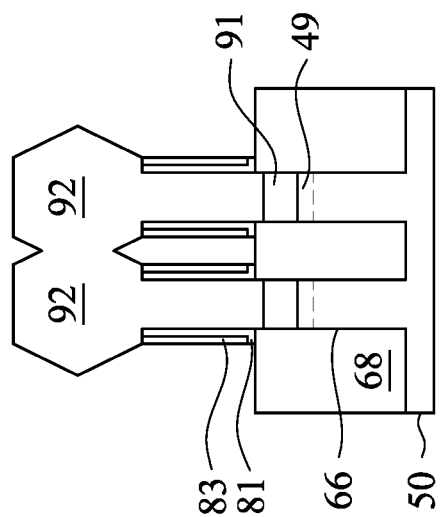
Figure 14A:
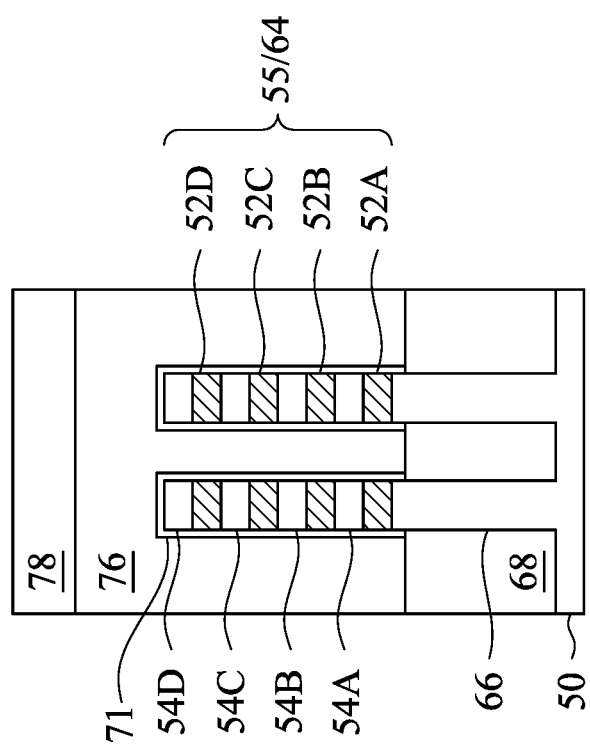
Figure 14D:
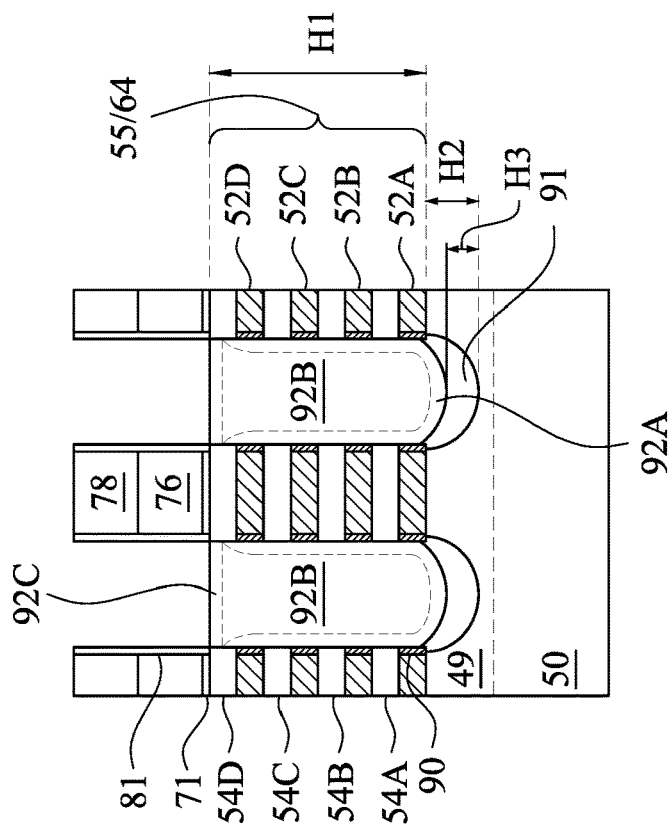

In FIGS. 14A through 14D, epitaxial source/drain regions 92 are formed in the first recesses 86 over the first epitaxial material 91. In some embodiments, the epitaxial source/drain regions 92 may exert stress on the second nanostructures 54A, 54B, 54C and 54D thereby improving performance. As illustrated in FIG. 14D, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the inner spacers 90 are used to separate the epitaxial source/drain regions 92 from the first nanostructures 52A, 52B, 52C and 52D by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86, in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54A, 54B, 54C and 54D such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions in the p-type region 50P, e.g., the PMOS region, may be formed by masking the n-type region 50N, e.g., the NMOS region. Then, the epitaxial source/drain regions 92 are epitaxially grown in the first recesses 86, in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52A, 52B, 52C and 52D, such as silicon-germanium, boron doped silicon-germanium, germanium, germanium tin, or the like. The epitaxial source/drain regions 92 may also have surfaces raised from respective surfaces of the nanostructures 55 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1 \times 10^{19}$ atoms/$cm^3$ and about $1 \times 10^{21}$ atoms/$cm^3$. The n-type and/or p-type impurities for source/drain regions may be any of the impurities previously discussed. In some embodiments, the epitaxial source/drain regions 92 may be in situ doped during growth.

Figure 14C:
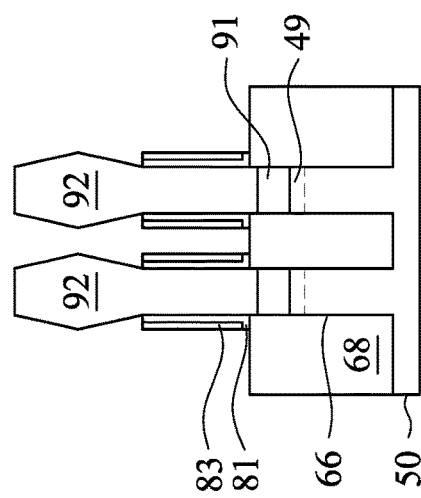

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge as illustrated by FIG. 14B. In other embodiments, adjacent epitaxial source/drain regions 92 remain separated after the epitaxy process is completed as illustrated by FIG. 14C. In the embodiments illustrated in FIGS. 14B and 14C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layers 92A, the second semiconductor material layers 92B, and the third semiconductor material layers 92C may be formed of different semiconductor materials and may be doped to different dopant concentrations. In some embodiments, the first semiconductor material layers 92A may have a dopant concentration less than the second semiconductor material layers 92B. In some embodiments, the second semiconductor material layers 92B may have a dopant concentration less than the third semiconductor material layers 92C. In some embodiments, the first semiconductor material layer 92A may have a lower germanium concentration than the second semiconductor material layer 92B. In some embodiments, the second semiconductor material layer 92B may have a lower germanium concentration than the third semiconductor material layer 92C. In embodiments in which the epitaxial source/drain regions 92 comprise three semiconductor material layers, the first semiconductor material layers 92A may be deposited, the second semiconductor material layers 92B may be deposited over the first semiconductor material layers 92A, and the third semiconductor material layers 92C may be deposited over the second semiconductor material layers 92B.

Figure 15B:
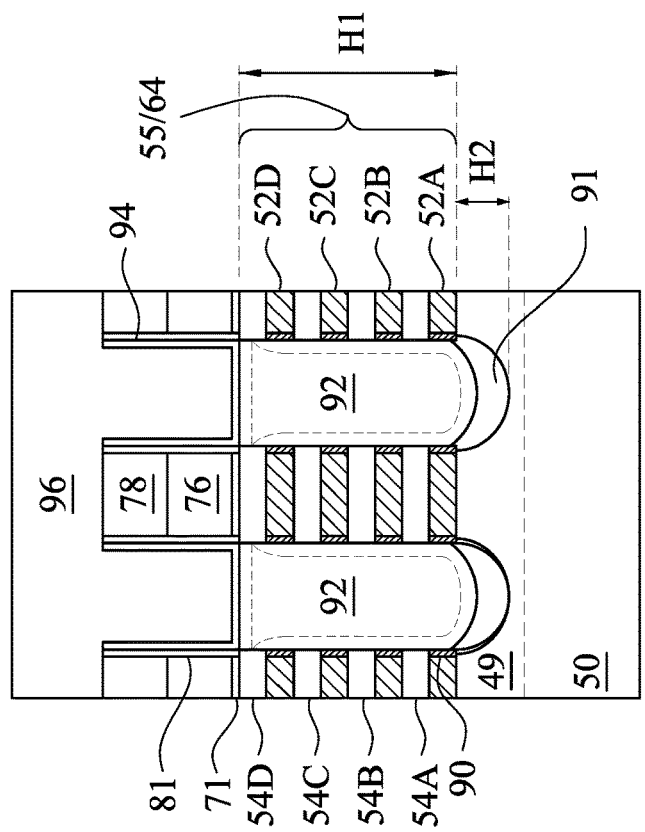
Figure 15A:
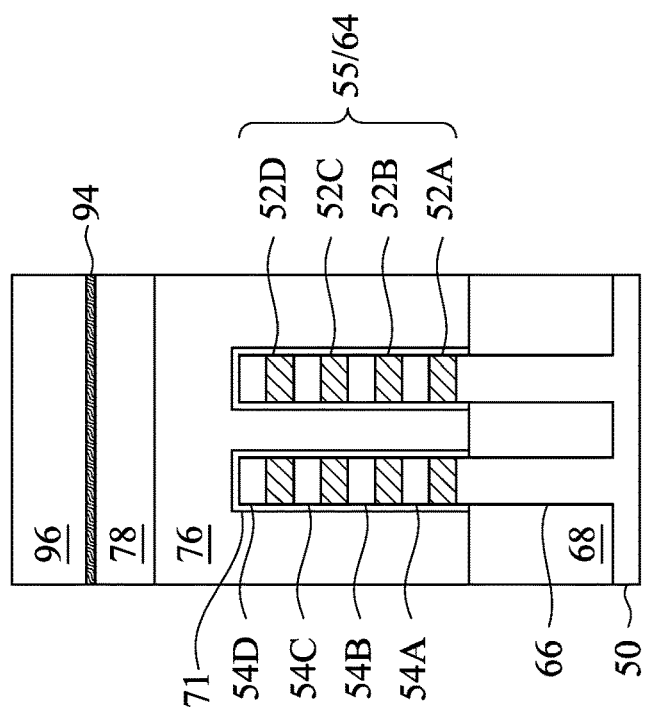

In FIGS. 15A and 15B, the first interlayer dielectric (ILD) 96 is deposited over the structure illustrated in FIGS. 14A through 14D. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, the first spacers 81 and the second spacers 83. The CESL 94 may comprise a dielectric material, such as, silicon nitride, silicon oxide, silicon oxynitride, or the like, having a different etch rate than the material of the overlying first ILD 96.

Figure 16B:
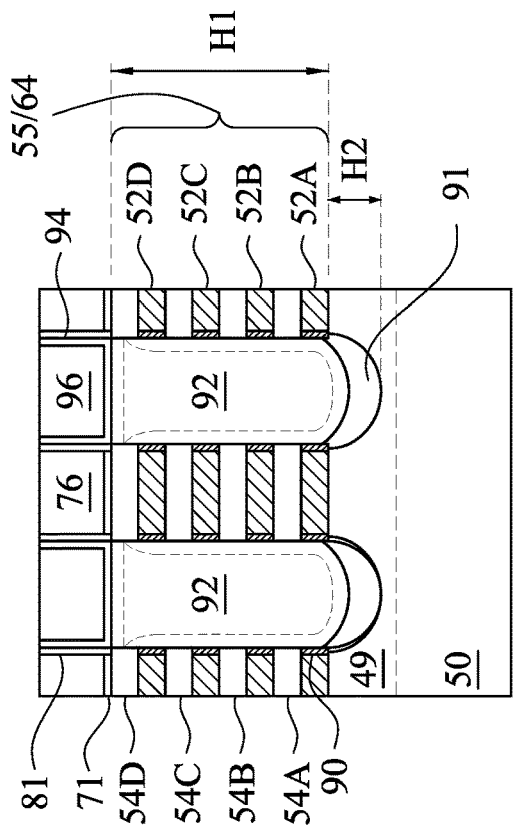
Figure 16A:
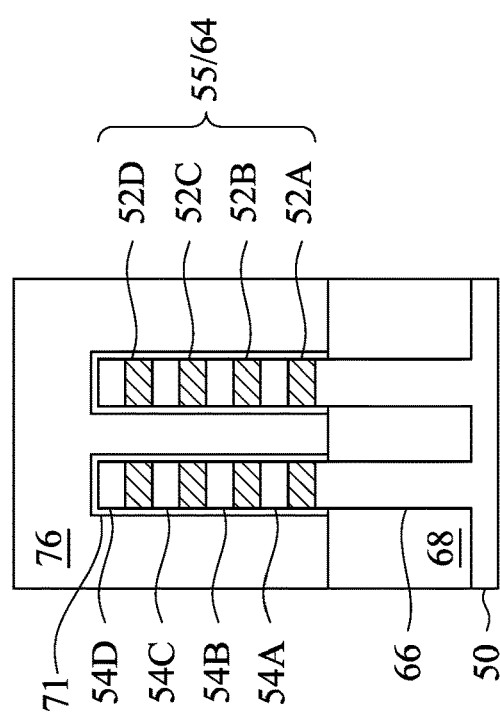

In FIGS. 16A and 16B, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level. Accordingly, the top surfaces of the dummy gates 76 are exposed through the first ILD 96. In some embodiments, the masks 78 may remain, in which case the planarization process levels the top surface of the first ILD 96 with top surface of the masks 78, and the first spacers 81.

Figure 17B:
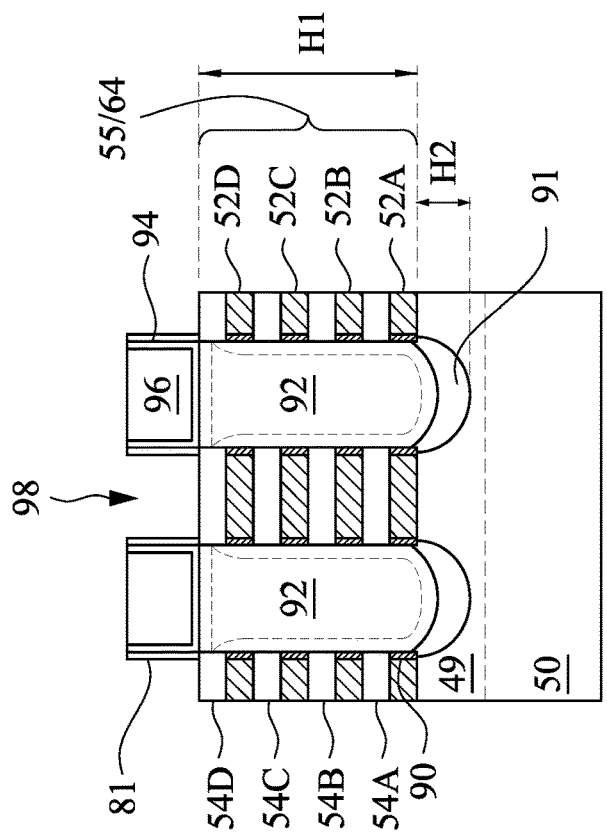
Figure 17A:
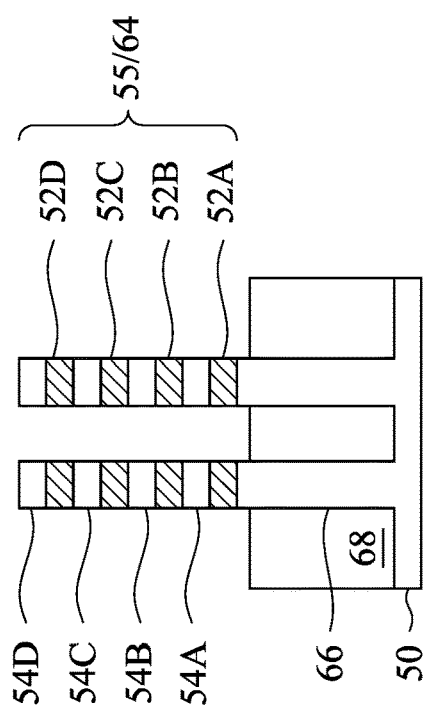

In FIGS. 17A and 17B, the dummy gates 76, and the masks 78 if present, are removed in an etching step(s), so that recesses 98 are formed. Portions of the dummy gate dielectrics 71 in the recesses 98 may also be removed. In some embodiments, only the dummy gates 76 are removed and the dummy gate dielectrics 71 remain and are exposed by the recesses 98. In some embodiments, the dummy gate dielectrics 71 are removed from recesses 98 in a first region of a die (e.g., a core logic region) and remains in recesses 98 in a second region of the die (e.g., an input/output region). In some embodiments, the dummy gates 76 are removed by an anisotropic dry etch process. For example, the etching process may include a dry etch process using reaction gas(es) that selectively etch the dummy gates 76 without etching the first ILD 96 and the first spacers 81. Each recess 98 exposes and/or overlies the multi-layer stacks 64. Portions of the multi-layer stacks 64 are disposed between neighboring pairs of the epitaxial source/drain regions 92. During the removal, the dummy gate dielectrics 71 may be used as an etch stop layer when the dummy gates 76 are etched. The dummy gate dielectrics 71 may then be optionally removed after the removal of the dummy gates 76.

Figure 18B:
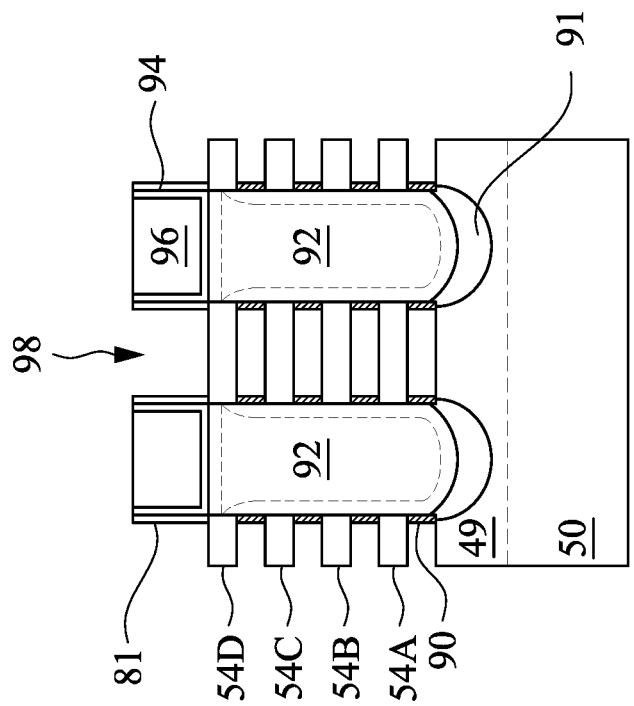
Figure 18A:
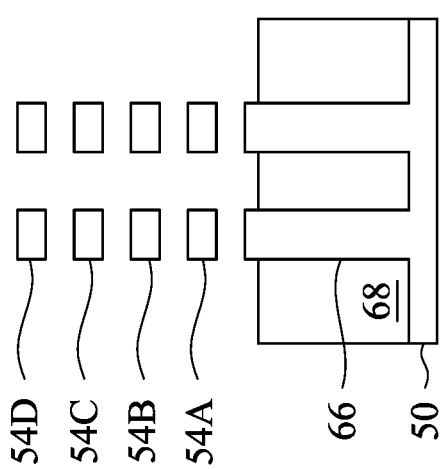

In FIGS. 18A and 18B, the first nanostructures 52A, 52B, 52C and 52D are removed from the regions 50N and the region 50P. The first nanostructures 52A, 52B, 52C and 52D may be removed by isotropic etching processes such as wet etching, dry etching, or the like. The etchants used to remove the first nanostructures 52A, 52B, 52C and 52D may be selective to the materials of the second nanostructures 54A, 54B, 54C and 54D. The second nanostructures 54A, 54B, 54C and 54D may also be subsequently referred to as channel layers 54A, 54B, 54C and 54D, respectively. In an embodiment in which first nanostructures 52A, 52B, 52C and 52D comprise the first semiconductor material (e.g., SiGe, or the like) and the second nanostructures 54A, 54B, 54C and 54D comprise the second semiconductor material (e.g., Si, SiC, or the like), an fluorine-based etchant, such as, hydrogen fluoride (HF), a fluorine based gas, or the like may be used remove layers of the multi-layer stack 64 in the regions 50N and region 50P.

Figure 19B:
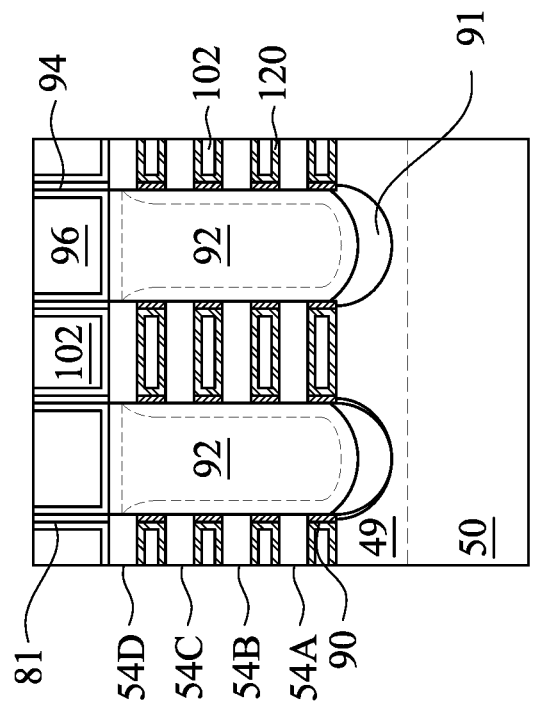
Figure 19A:
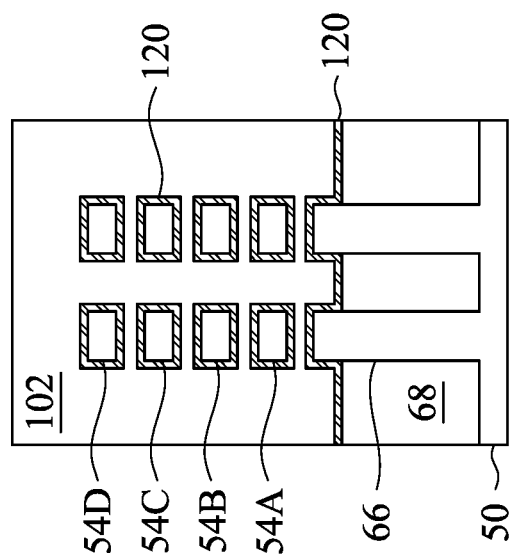

In FIGS. 19A and 19B, gate dielectric layers 120 and gate electrodes 102 are formed for replacement gates. The gate dielectric layers 120 are deposited conformally in the recesses 98. The gate dielectric layers 120 may be formed on top surfaces, sidewalls, and bottom surfaces of the second nanostructures 54A, 54B, 54C and 54D. The gate dielectric layers 120 may also be deposited on top surfaces of the first ILD 96, the CESL 94, the first spacers 81, and the STI regions 68 and on sidewalls of the first spacers 81 and the inner spacers 90.

In accordance with some embodiments, the gate dielectric layers 120 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 120 include a high-k dielectric material, and in these embodiments, the gate dielectric layers 120 may have a k-value greater than about 7.0, and may include a metal oxide or a silicate of hafnium, aluminum, zirconium, lanthanum, manganese, barium, titanium, lead, and combinations thereof. The structure of the gate dielectric layers 120 may be the same or different in the n-type region 50N and the p-type region 50P. The formation methods of the gate dielectric layers 120 may include molecular-beam deposition (MBD), ALD, PECVD, and the like.

The gate electrodes 102 are deposited over the gate dielectric layers 120, respectively, and fill the remaining portions of the recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 19A and 19B, the gate electrodes 102 may comprise any number of liner layers, any number of work function tuning layers, and a fill material. Any combination of the layers which make up the gate electrodes 102 may be deposited between adjacent ones of the second nanostructures 54.

The formation of the gate dielectric layers 120 in the n-type region 50N and the p-type region 50P may occur simultaneously such that the gate dielectric layers 120 in each region are formed from the same materials, and the formation of the gate electrodes 102 may occur simultaneously such that the gate electrodes 102 in each region are formed from the same materials. In some embodiments, the gate dielectric layers 120 in each region may be formed by distinct processes, such that the gate dielectric layers 120 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the recesses 98, a planarization process, such as a CMP, may be performed to remove the excess portions of the gate dielectric layers 120 and the material of the gate electrodes 102, which excess portions are over the top surface of the first ILD 96. The remaining portions of material of the gate electrodes 102 and the gate dielectric layers 120 thus form replacement gate structures of the resulting nano-FETs. The gate electrodes 102 and the gate dielectric layers 120 may be collectively referred to as "gate structures."

Figure 20B:
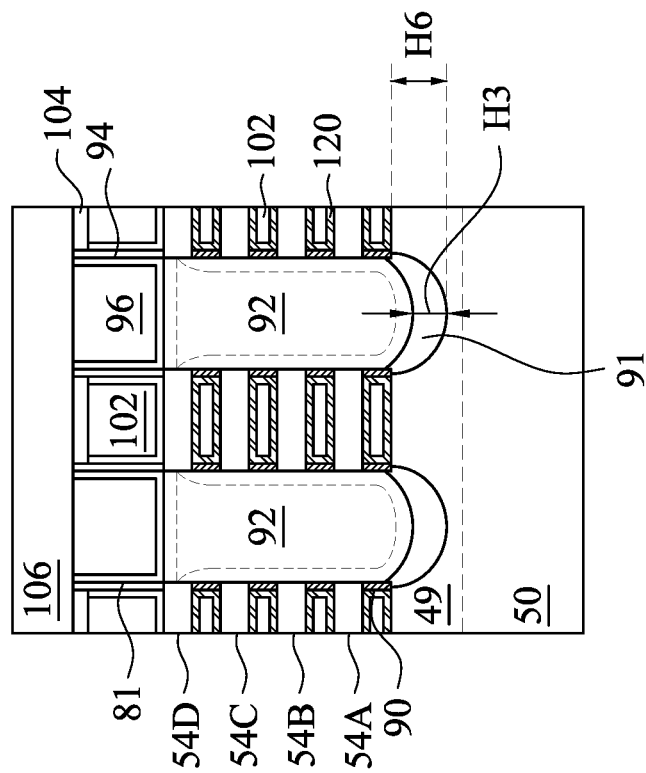
Figure 20A:
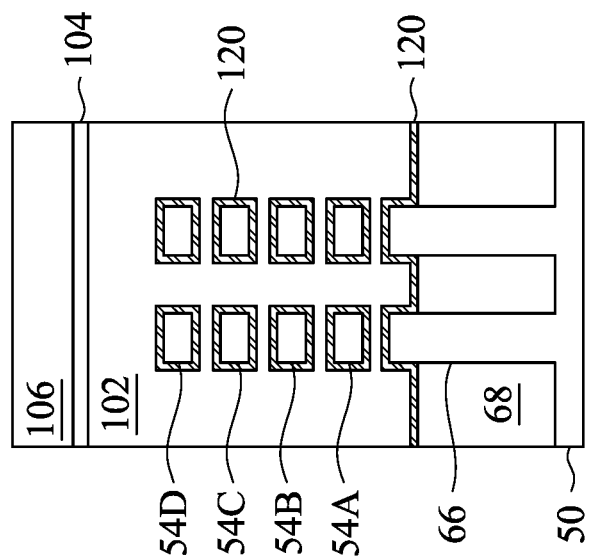

In FIGS. 20A and 20B, a structure that illustrates the embodiment of FIG. 12C is shown. The gate structures (including the gate dielectric layers 120 and the corresponding overlying gate electrodes 102) are recessed, so that recess are formed directly over the gate structures and between opposing portions of first spacers 81. Gate masks 104 comprising one or more layers of dielectric material, such as silicon nitride, silicon oxynitride, or the like, are filled in the recesses, followed by a planarization process to remove excess portions of the dielectric material extending over the first ILD 96. Subsequently formed gate contacts (such as the gate contacts 114, discussed below with respect to FIGS. 22A and 22B) penetrate through the gate masks 104 to contact the top surfaces of the recessed gate electrodes 102.

In an embodiment, a sixth height H6 from a bottommost surface of the gate structures (e.g., the gate dielectric layers 120 and the gate electrodes 102) to a bottommost point of the first epitaxial material 91 may be in a range from 15 nm to 25 nm. As shown in FIG. 20B, in an embodiment, a bottommost point of a top surface of the first epitaxial material 91 is lower than the bottommost surface of the gate structures (e.g., the gate dielectric layers 120 and the gate electrodes 102).

Figure 20D:
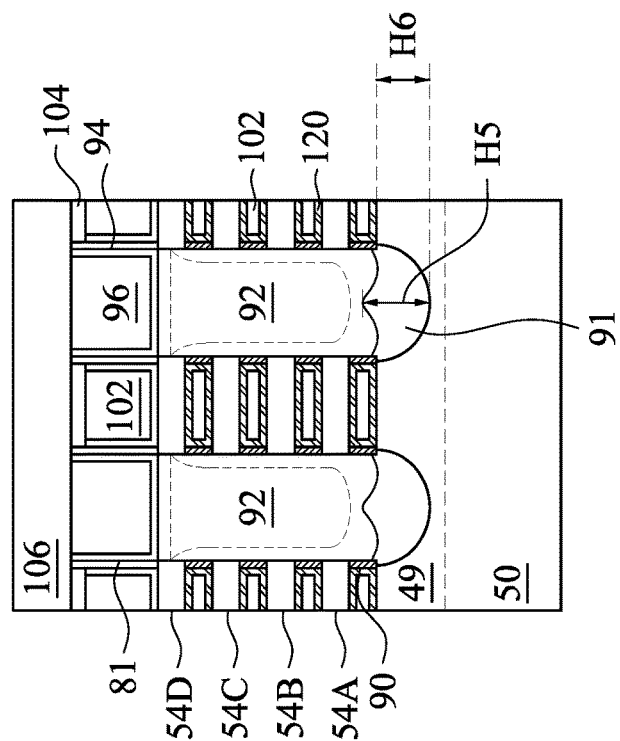
Figure 20C:
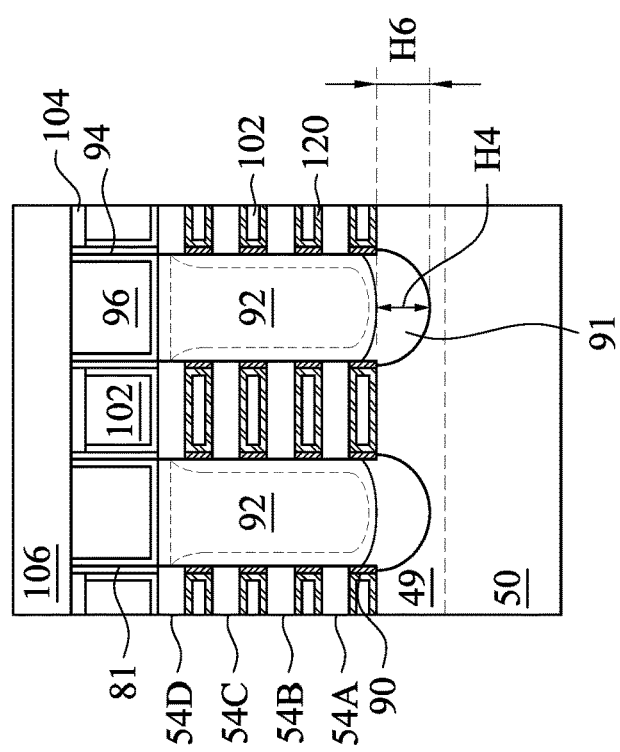

In FIG. 20C, a structure that illustrates the embodiment of FIG. 12D is shown. In an embodiment, a bottommost point of a top surface of the first epitaxial material 91 is at the same level as the bottommost surface of the gate structures (e.g., the gate dielectric layers 120 and the gate electrodes 102). In the embodiment of FIG. 20C, the fourth height H4 from a bottommost point of a top surface of the first epitaxial material 91 to a bottommost point of the first epitaxial material 91 is equal to the sixth Height H6.

In FIG. 20D, a structure that illustrates the alternative embodiment of FIG. 12E is shown. Unless specified otherwise, like reference numerals in this embodiment (and subsequently discussed embodiments) represent like components in the embodiment shown in FIGS. 20A through 20C formed by like processes. Accordingly, the process steps and applicable materials may not be repeated herein. In an embodiment, a sixth height H6 from a bottommost surface of the gate structures (e.g., the gate dielectric layers 120 and the gate electrodes 102) to a bottommost point of the first epitaxial material 91 may be in a range from 15 nm to 25 nm. As shown in FIG. 20D, in some embodiments, a topmost point of the first epitaxial material 91 is higher than the bottommost surface of the gate structures (e.g., the gate dielectric layers 120 and the gate electrodes 102). In an embodiment, the topmost point of a top surface of the first epitaxial material 91 is located at a central or middle point of the top surface of the first epitaxial material 91.

The height of the bottommost point of the top surface of the first epitaxial material 91 and/or the topmost point of the first epitaxial material 91 in relation to the level of the bottommost surface of the gate structures (e.g., the gate dielectric layers 120 and the gate electrodes 102) influences the amount by which the enlarged electric field that forms as result of the APT implantation is reduced by and provide some advantageous features. The higher the bottommost point of the top surface of the first epitaxial material 91 or the topmost point of the first epitaxial material 91 is in relation to the level of the bottommost surface of the gate structures (e.g., the gate dielectric layers 120 and the gate electrodes 102), the larger the possible reduction of the enlarged electric field. The advantageous features include the ability to control the amount by which the enlarged electric field formed as result of the APT implantation is reduced.

As further illustrated by FIGS. 20A through 20D, a second ILD 106 is deposited over the first ILD 96 and over the gate masks 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 21B:
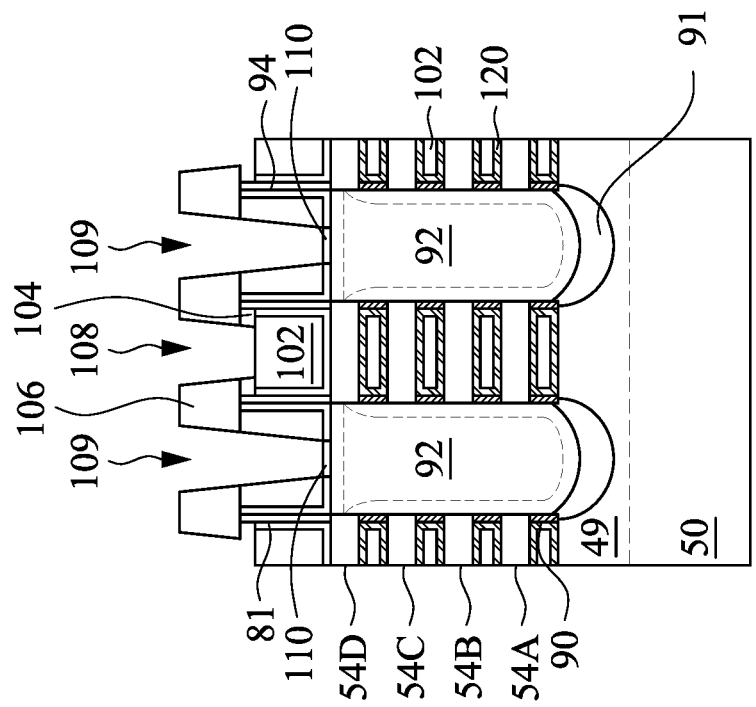
Figure 21A:
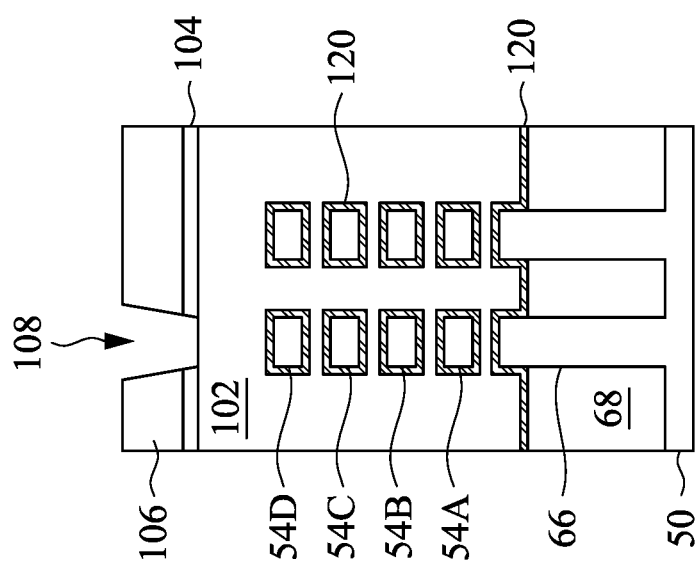

In FIGS. 21A and 21B, openings 108 for gate contacts 114 (shown subsequently in FIGS. 22A and 22B) are formed through the second ILD 106 and the gate mask 104, and openings 109 for source/drain contacts 112 (shown subsequently in FIG. 22B) are formed through the second ILD 106 and the first ILD 96. The openings 108 and 109 may be formed using acceptable photolithography and etching techniques. The openings 108 may expose surfaces of the gate structures and the openings 109 may expose surfaces of the epitaxial source/drain regions 92. Silicide regions 110 are formed over the epitaxial source/drain regions 92 by first depositing a metal (not separately illustrated) capable of reacting with the semiconductor materials of the underlying epitaxial source/drain regions 92 (e.g. silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, and then performing a thermal anneal process to form the silicide regions 110. The un-reacted portions of the deposited metal are then removed, e.g., by an etching process.

Figure 22B:
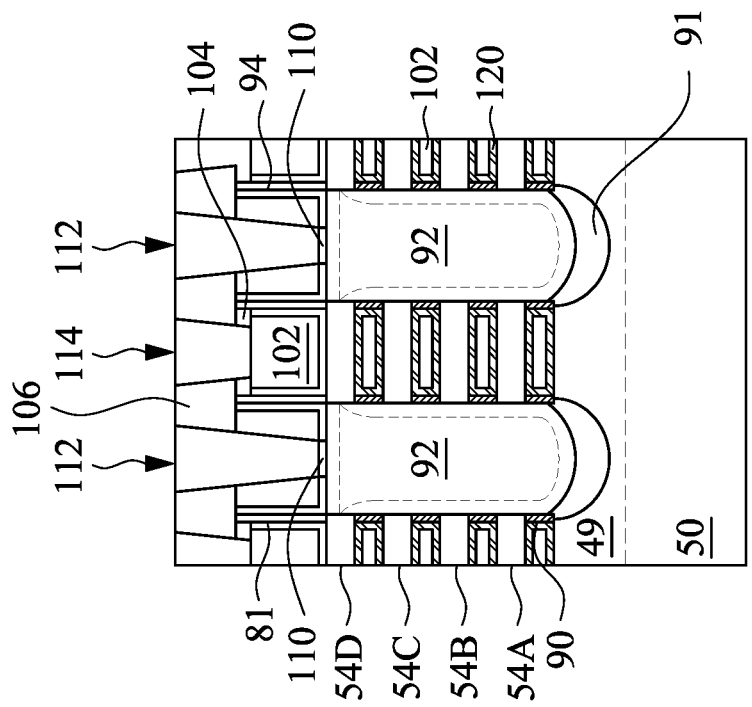
Figure 22A:
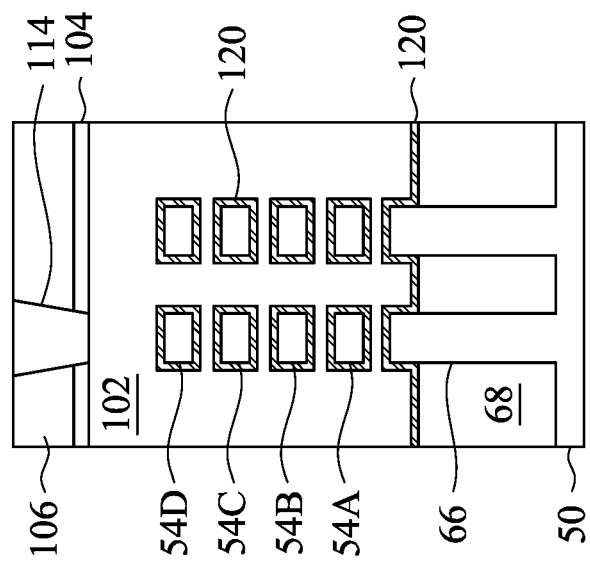

In FIGS. 22A and 22B, a liner, such as a diffusion barrier layer, an adhesion layer, or the like, and a conductive material are formed in the openings 108 and 109. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106. The remaining liner and conductive material form the gate contacts 114 in the openings 108, and the source/drain contacts 112 in the openings 109. The gate contacts 114 are physically and electrically coupled to the gate electrodes 102, and the source/drain contacts 112 are physically and electrically coupled to the epitaxial source/drain regions 92.

The embodiments of the present disclosure have some advantageous features. The embodiments include the performing an anti-punch-through (APT) implantation on an upper portion of a semiconductor fin, followed by forming semiconductor nanostructures over the semiconductor fin. A recess is formed in the semiconductor nanostructures and the semiconductor fin. Subsequently, an undoped silicon layer is formed in the recess. An ion implantation process is performed on the silicon layer such that the silicon layer has a gradient-doped profile. A source/drain region is then formed in the recess over the gradient-doped silicon layer. One or more embodiments disclosed herein may allow for a reduction of the enlarged electric field that forms as result of the APT implantation, and therefore the mitigation of the junction leakage current ($Ib_{off}$) caused by the enlarged electric field. In addition, the disclosed embodiments lead to improved device performance as the junction leakage current may be reduced by an order of magnitude that is in a range from 1 to 2. Further, the disclosed method may be integrated easily into existing processes and provides a solution to junction leakage current with lower manufacturing costs.

In accordance with an embodiment, a method includes depositing a multi-layer stack over a semiconductor substrate, the multi-layer stack including a plurality of sacrificial layers that alternate with a plurality of channel layers; forming a first recess in the multi-layer stack; forming first spacers on sidewalls of the sacrificial layers in the first recess; depositing a first semiconductor material in the first recess, where the first semiconductor material is undoped, where the first semiconductor material is in physical contact with a sidewall and a bottom surface of at least one of the first spacers; implanting dopants in the first semiconductor material, where after implanting dopants the first semiconductor material has a gradient-doped profile; forming an epitaxial source/drain region in the first recess over the first semiconductor material, where a material of the epitaxial source/drain region is different from the first semiconductor material; removing the sacrificial layers to form a second recess; and forming a gate structure in the second recess. In an embodiment, implanting dopants in the first semiconductor material includes an implantation process that implants arsenic (As), phosphorous (P), antimony (Sb), boron difluoride (BF2), or boron (B) into the first semiconductor material. In an embodiment, where after the implantation process, a dopant concentration in the first semiconductor material is in a range from $1\times10^{17}$ atoms/cm$^3$ to $1\times10^{20}$ atoms/cm$^3$. In an embodiment, implanting dopants in the first semiconductor material further includes directing an implantation species at a first tilt angle with respect to an axis that is perpendicular to a major surface of the semiconductor substrate, where the first tilt angle is in a range from 0° to 15°. In an embodiment, a first height from a bottommost surface of the gate structure to a bottommost point of the first semiconductor material is in a range from 15 nm to 25 nm. In an embodiment, a bottommost point of a top surface of the first semiconductor material is lower than a bottommost surface of the gate structure. In an embodiment, a bottommost point of a top surface of the first semiconductor material is at the same level as a bottommost surface of the gate structure. In an embodiment, the first semiconductor material includes silicon.

In accordance with an embodiment, a method includes depositing a first sacrificial layer over a semiconductor substrate, where a top portion of the semiconductor substrate includes dopants of a first conductivity type; depositing a first channel layer over the first sacrificial layer; etching a first recess that extends through the first sacrificial layer, the first channel layer, and the top portion of the semiconductor substrate; depositing an undoped silicon layer in the first recess; performing an implantation process on the undoped silicon layer to provide a gradient-doped silicon layer; forming a first source/drain region over the gradient-doped silicon layer in the first recess, the first source/drain region extending through the first sacrificial layer and the first channel layer, where the first source/drain region includes a second material that is different from a first material of the gradient-doped silicon layer, and where the first material includes dopants of a second conductivity type opposite that of the first conductivity type; etching the first sacrificial layer using a first etch process to form a second recess; depositing a gate dielectric layer in the second recess; and depositing a gate electrode in the second recess, where the gate dielectric layer and the gate electrode fill the second recess. In an embodiment, the gradient-doped silicon layer isolates the top portion of the semiconductor substrate from the first source/drain region. In an embodiment, the gradient-doped silicon layer has a dopant concentration that increases in a direction from a top surface of the gradient-doped silicon layer towards a bottom surface of the semiconductor substrate up to a first depth of the gradient-doped silicon layer. In an embodiment, performing the implantation process on the undoped silicon layer further includes implanting dopants into the undoped silicon layer at a temperature that is in a range from −60° C. to 450° C. In an embodiment, performing the implantation process on the undoped silicon layer further includes implanting dopants into the undoped silicon layer using an ion beam that has a dose that is in a range from $5\times10^{13}$ atoms/cm$^2$ to $1\times10^{15}$ atoms/cm$^2$. In an embodiment, a bottom surface of the first sacrificial layer and a bottommost point of a top surface of the undoped silicon layer are at the same level.

In accordance with an embodiment, a semiconductor device includes a gate structure over a semiconductor substrate; source/drain regions over the semiconductor substrate and on opposing sides of the gate structure, where the source/drain regions include a first material; a second material under each of the source/drain regions, where the second material is disposed between the semiconductor substrate and each source/drain region, where a bottommost point of a top surface of the second material is at the same level as a bottommost surface of the gate structure, and where the second material includes a gradient-doped profile; a first channel layer disposed between the source/drain regions and over the semiconductor substrate; and inner spacers between first end portions of the first channel layer and the semiconductor substrate, where the gate structure fills a space between the inner spacers, and where the second material physically contacts bottom surfaces and sidewalls of the inner spacers. In an embodiment, the second material includes a curved bottom surface that continuously curves from a bottom surface of a first of the inner spacers to a bottom surface of a second of the inner spacers. In an embodiment, a topmost point of the second material is higher than the bottom surfaces of the gate structure. In an embodiment, the first material and the second material include different materials. In an embodiment, a dopant concentration of the second material is lower than a dopant concentration of the first material. In an embodiment, a dopant concentration in the second material is in a range from $1\times10^{17}$ atoms/cm$^3$ to $1\times10^{20}$ atoms/cm$^3$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing a multi-layer stack over a semiconductor substrate, the multi-layer stack comprising a plurality of sacrificial layers that alternate with a plurality of channel layers;
forming a first recess in the multi-layer stack;
forming first spacers on sidewalls of the sacrificial layers in the first recess;
depositing a first semiconductor material in the first recess, wherein the first semiconductor material is undoped, wherein the first semiconductor material is in physical contact with a sidewall and a bottom surface of at least one of the first spacers;
implanting dopants in the first semiconductor material, wherein after implanting dopants the first semiconductor material has a gradient-doped profile;
forming an epitaxial source/drain region in the first recess over the first semiconductor material, wherein a material of the epitaxial source/drain region is different from the first semiconductor material;
removing the sacrificial layers to form a second recess; and
forming a gate structure in the second recess.

2. The method of claim 1, wherein implanting dopants in the first semiconductor material comprises an implantation process that implants arsenic (As), phosphorous (P), antimony (Sb), boron di-fluoride ($BF_2$), or boron (B) into the first semiconductor material.

3. The method of claim 2, wherein after the implantation process, a dopant concentration in the first semiconductor material is in a range from $1 \times 10^{17}$ atoms/cm$^3$ to $1 \times 10^{20}$ atoms/cm$^3$.

4. The method of claim 1, wherein implanting dopants in the first semiconductor material further comprises directing an implantation species at a first tilt angle with respect to an axis that is perpendicular to a major surface of the semiconductor substrate, wherein the first tilt angle is in a range from 0° to 15°.

5. The method of claim 1, wherein a first height from a bottommost surface of the gate structure to a bottommost point of the first semiconductor material is in a range from 15 nm to 25 nm.

6. The method of claim 1, wherein a bottommost point of a top surface of the first semiconductor material is lower than a bottommost surface of the gate structure.

7. The method of claim 1, wherein a bottommost point of a top surface of the first semiconductor material is at the same level as a bottommost surface of the gate structure.

8. The method of claim 1, wherein the first semiconductor material comprises silicon.

9. A method comprising:
depositing a first sacrificial layer over a semiconductor substrate, wherein a top portion of the semiconductor substrate comprises dopants of a first conductivity type;
depositing a first channel layer over the first sacrificial layer;
etching a first recess that extends through the first sacrificial layer, the first channel layer, and the top portion of the semiconductor substrate;
depositing an undoped silicon layer in the first recess;
performing an implantation process on the undoped silicon layer to provide a gradient-doped silicon layer;
forming a first source/drain region over the gradient-doped silicon layer in the first recess, the first source/drain region extending through the first sacrificial layer and the first channel layer, wherein the first source/drain region comprises a second material that is different from a first material of the gradient-doped silicon layer, and wherein the first material comprises dopants of a second conductivity type opposite that of the first conductivity type;
etching the first sacrificial layer using a first etch process to form a second recess;
depositing a gate dielectric layer in the second recess; and
depositing a gate electrode in the second recess, wherein the gate dielectric layer and the gate electrode fill the second recess.

10. The method of claim 9, wherein the gradient-doped silicon layer isolates the top portion of the semiconductor substrate from the first source/drain region.

11. The method of claim 9, wherein the gradient-doped silicon layer has a dopant concentration that increases in a direction from a top surface of the gradient-doped silicon layer towards a bottom surface of the semiconductor substrate up to a first depth of the gradient-doped silicon layer.

12. The method of claim 9, wherein performing the implantation process on the undoped silicon layer further comprises implanting dopants into the undoped silicon layer at a temperature that is in a range from −60° C. to 450° C.

13. The method of claim 9, wherein performing the implantation process on the undoped silicon layer further comprises implanting dopants into the undoped silicon layer using an ion beam that has a dose that is in a range from $5 \times 10^{13}$ atoms/cm$^2$ to $1 \times 10^{15}$ atoms/cm$^2$.

14. The method of claim 9, wherein a bottom surface of the first sacrificial layer and a bottommost point of a top surface of the undoped silicon layer are at the same level.

15. A method comprising:
depositing a multi-layer stack over a semiconductor substrate, the multi-layer stack comprising a plurality of sacrificial layers that alternate with a plurality of channel layers;
patterning the multi-layer stack and the semiconductor substrate to form a fin that includes first nanostructures defined from the plurality of sacrificial layers and second nanostructures defined from the plurality of channel layers;
etching the fin to form a source/drain recess in the fin;
depositing a first semiconductor material in the source/drain recess, wherein the first semiconductor material is undoped;
performing an implantation process to implant dopants in the first semiconductor material, wherein after performing the implantation process, the first semiconductor material has a gradient-doped profile;
forming an epitaxial source/drain region in the source/drain recess over the first semiconductor material, wherein the epitaxial source/drain region comprises a first semiconductor layer over the first semiconductor material, wherein the first semiconductor layer comprises a first material that is different from the first semiconductor material; and
replacing the first nanostructures with a gate structure.

16. The method of claim 15, wherein the epitaxial source/drain region further comprises:
- a second semiconductor layer over the first semiconductor layer; and
- a third semiconductor layer over the second semiconductor layer, wherein a dopant concentration of the first semiconductor material is lower than dopant concentrations of the first semiconductor layer, the second semiconductor layer, and the third semiconductor layer.

17. The method of claim 16, wherein the dopant concentration of the first semiconductor layer is lower than the dopant concentration of the second semiconductor layer, and the dopant concentration of the second semiconductor layer is lower than the dopant concentration of the third semiconductor layer.

18. The method of claim 16, wherein a germanium concentration of the first semiconductor layer is lower than a germanium concentration of the second semiconductor layer, and the germanium concentration of the second semiconductor layer is lower than a germanium concentration of the third semiconductor layer.

19. The method of claim 15, wherein the first semiconductor material comprises silicon.

20. The method of claim 15, wherein after performing the implantation process, a dopant concentration in the first semiconductor material is in a range from $1 \times 10^{17}$ atoms/cm$^3$ to $1 \times 10^{20}$ atoms/cm$^3$.

* * * * *